US011177383B2

(12) United States Patent
Chang et al.

(10) Patent No.: US 11,177,383 B2
(45) Date of Patent: Nov. 16, 2021

(54) SEMICONDUCTOR DEVICE STRUCTURE AND METHOD FOR FORMING THE SAME

(71) Applicant: Taiwan Semiconductor Manufacturing Co., Ltd., Hsinchu (TW)

(72) Inventors: Chia-Hao Chang, Hsinchu (TW); Sheng-Tsung Wang, Hsinchu (TW); Lin-Yu Huang, Hsinchu (TW); Chia-Lin Chuang, Taoyuan (TW); Cheng-Chi Chuang, New Taipei (TW); Yu-Ming Lin, Hsinchu (TW); Chih-Hao Wang, Baoshan Township, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/785,985

(22) Filed: Feb. 10, 2020

(65) Prior Publication Data
US 2021/0249537 A1   Aug. 12, 2021

(51) Int. Cl.
*H01L 29/49* (2006.01)
*H01L 21/764* (2006.01)
*H01L 23/522* (2006.01)
*H01L 29/08* (2006.01)
(Continued)

(52) U.S. Cl.
CPC ........ *H01L 29/7848* (2013.01); *H01L 21/764* (2013.01); *H01L 21/76224* (2013.01);
(Continued)

(58) Field of Classification Search
CPC ......... H01L 21/02271; H01L 21/31116; H01L 21/76224; H01L 21/764; H01L 21/7682; H01L 21/823431; H01L 21/823821; H01L 21/845; H01L 27/0886; H01L 27/0924; H01L 27/10826; H01L 27/10879; H01L 27/1211; H01L 27/6653; H01L 27/66553;
(Continued)

(56) References Cited

U.S. PATENT DOCUMENTS 8,772,109 B2   7/2014   Colinge
8,785,285 B2   7/2014   Tsai et al.
(Continued)

*Primary Examiner* — David C Spalla
(74) *Attorney, Agent, or Firm* — McClure, Qualey & Rodack, LLP

(57) ABSTRACT

A semiconductor device structure is provided. The semiconductor device structure includes a substrate having a base and a fin over the base. The semiconductor device structure includes a gate stack wrapping around a first upper portion of the fin. The semiconductor device structure includes a first stressor and a second stressor respectively over opposite first sides of the fin. The semiconductor device structure includes a spacer structure between the gate stack and the first stressor. The semiconductor device structure includes a first spacer layer covering a sidewall of the gate stack, the spacer structure, and the first stressor. The semiconductor device structure includes a dielectric layer over the first spacer layer. The semiconductor device structure includes an etch stop layer between the first spacer layer and the dielectric layer. The semiconductor device structure includes a seal structure between the second upper portion and the third upper portion.

20 Claims, 38 Drawing Sheets

(51) Int. Cl.
*H01L 29/66* (2006.01)
*H01L 29/78* (2006.01)
*H01L 21/762* (2006.01)
*H01L 21/311* (2006.01)
*H01L 21/02* (2006.01)

(52) U.S. Cl.
CPC ...... *H01L 29/0847* (2013.01); *H01L 29/6653* (2013.01); *H01L 29/6656* (2013.01); *H01L 29/66795* (2013.01); *H01L 29/7851* (2013.01); *H01L 21/02271* (2013.01); *H01L 21/31116* (2013.01)

(58) Field of Classification Search
CPC ............. H01L 27/6656; H01L 29/0649; H01L 29/0847; H01L 29/41791; H01L 29/66795; H01L 29/7848; H01L 29/785; H01L 29/7851
See application file for complete search history.

(56) References Cited

U.S. PATENT DOCUMENTS

| | | | |
|---|---|---|---|
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,379,004 B1* | 6/2016 | Kwon | H01L 29/6656 |
| 9,520,482 B1 | 12/2016 | Chang et al. | |
| 9,576,814 B2 | 2/2017 | Wu et al. | |
| 10,062,764 B1* | 8/2018 | Wu | H01L 29/785 |
| 10,741,654 B2* | 8/2020 | Li | H01L 29/41775 |
| 2016/0365426 A1* | 12/2016 | Ching | H01L 21/283 |
| 2019/0334008 A1* | 10/2019 | Chen | H01L 29/4991 |
| 2019/0378909 A1* | 12/2019 | Cheng | H01L 29/6656 |

* cited by examiner

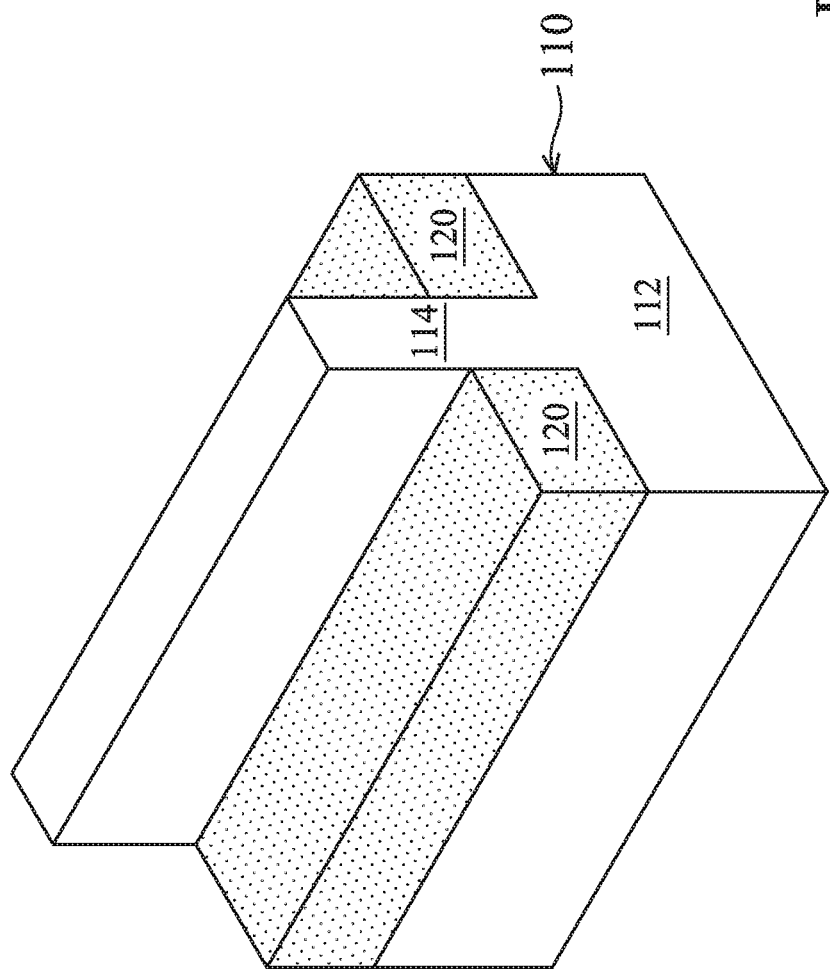

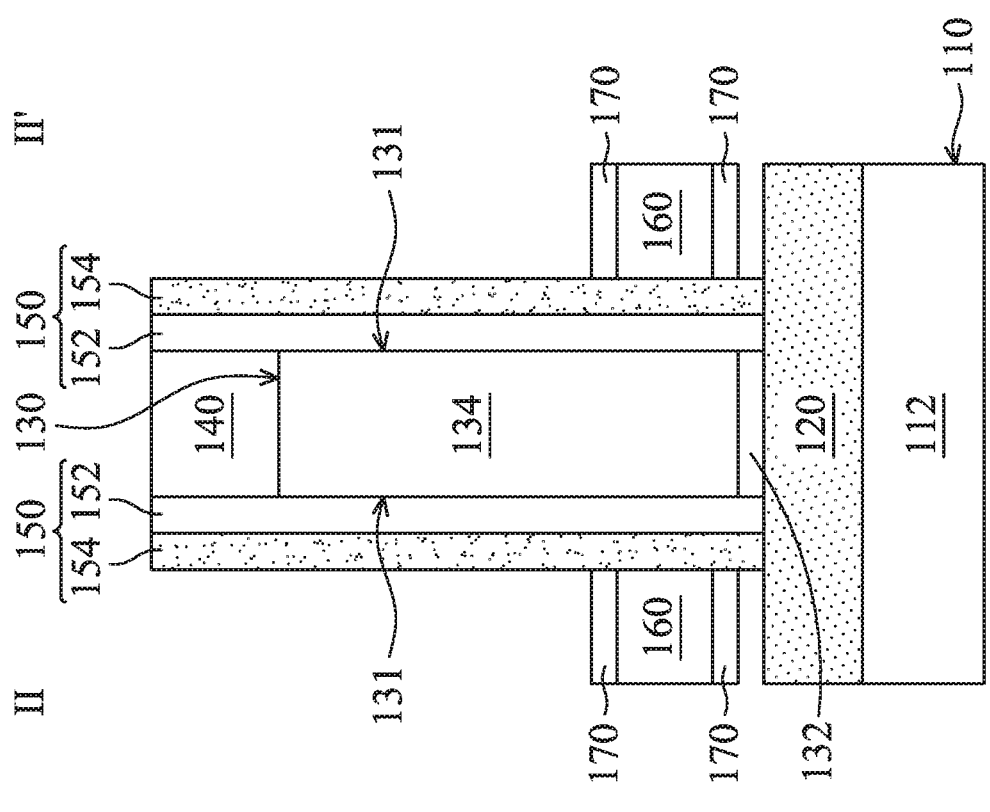
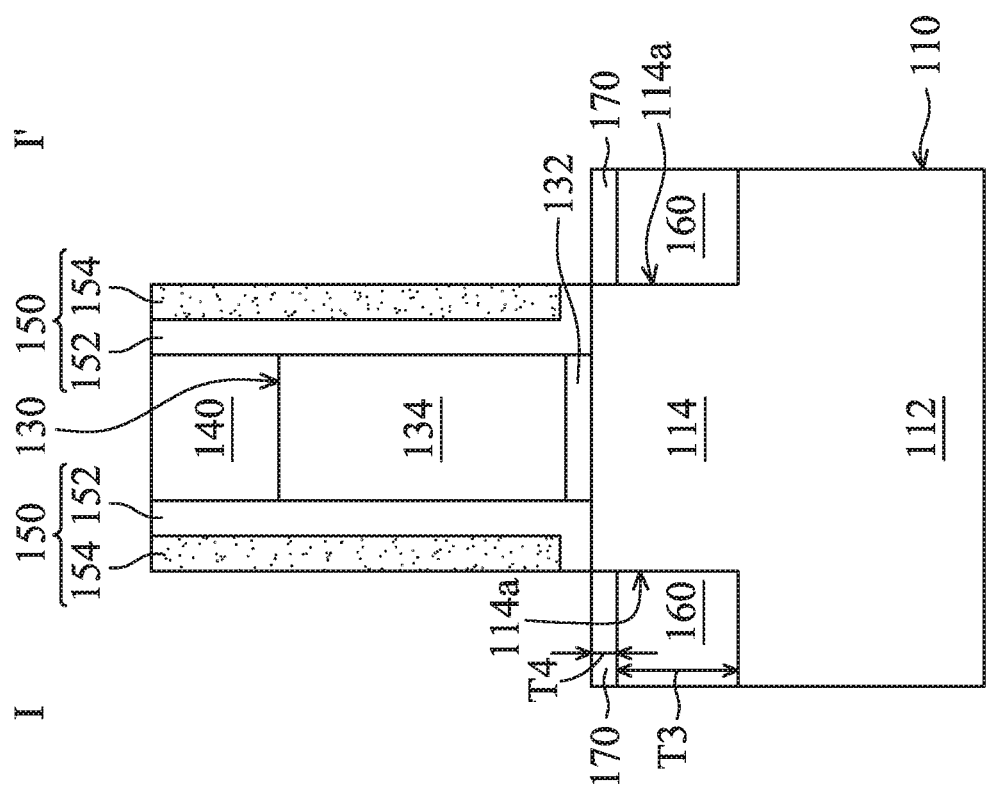

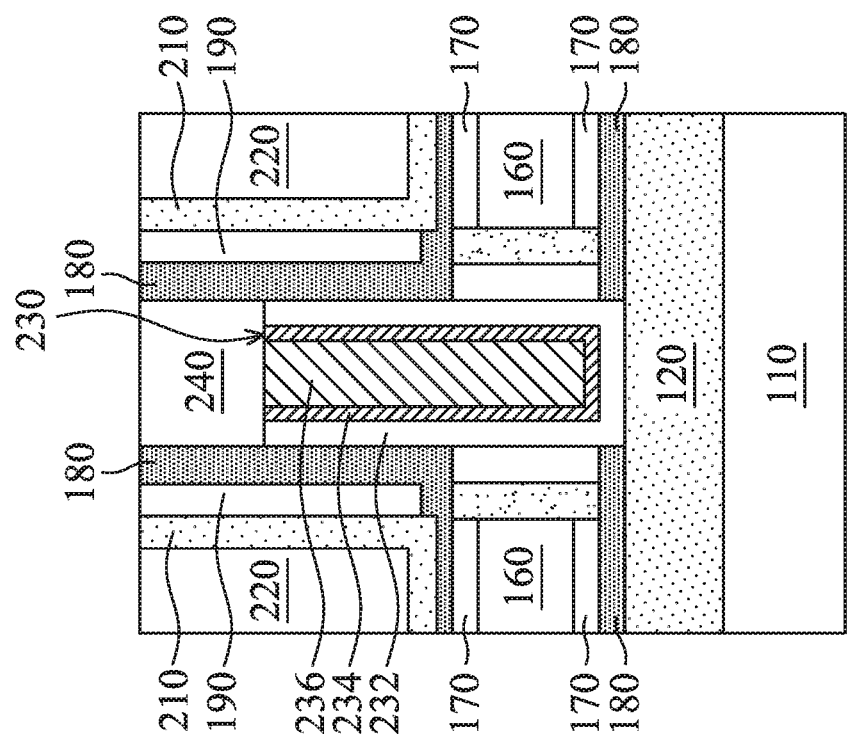
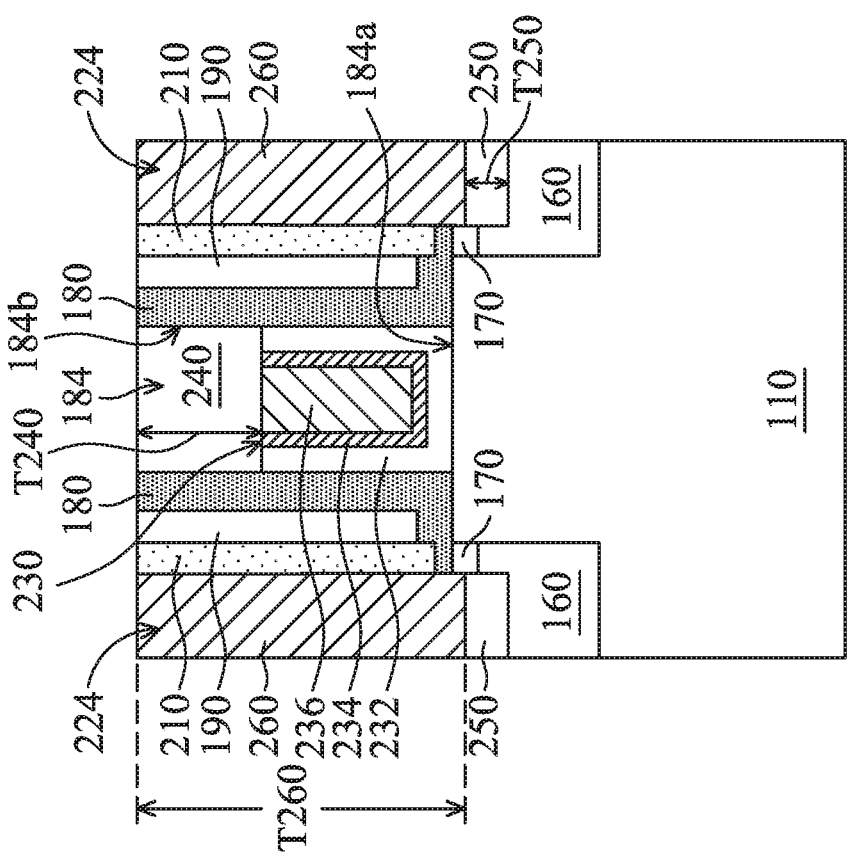
FIG. 2F-1
FIG. 2F-2

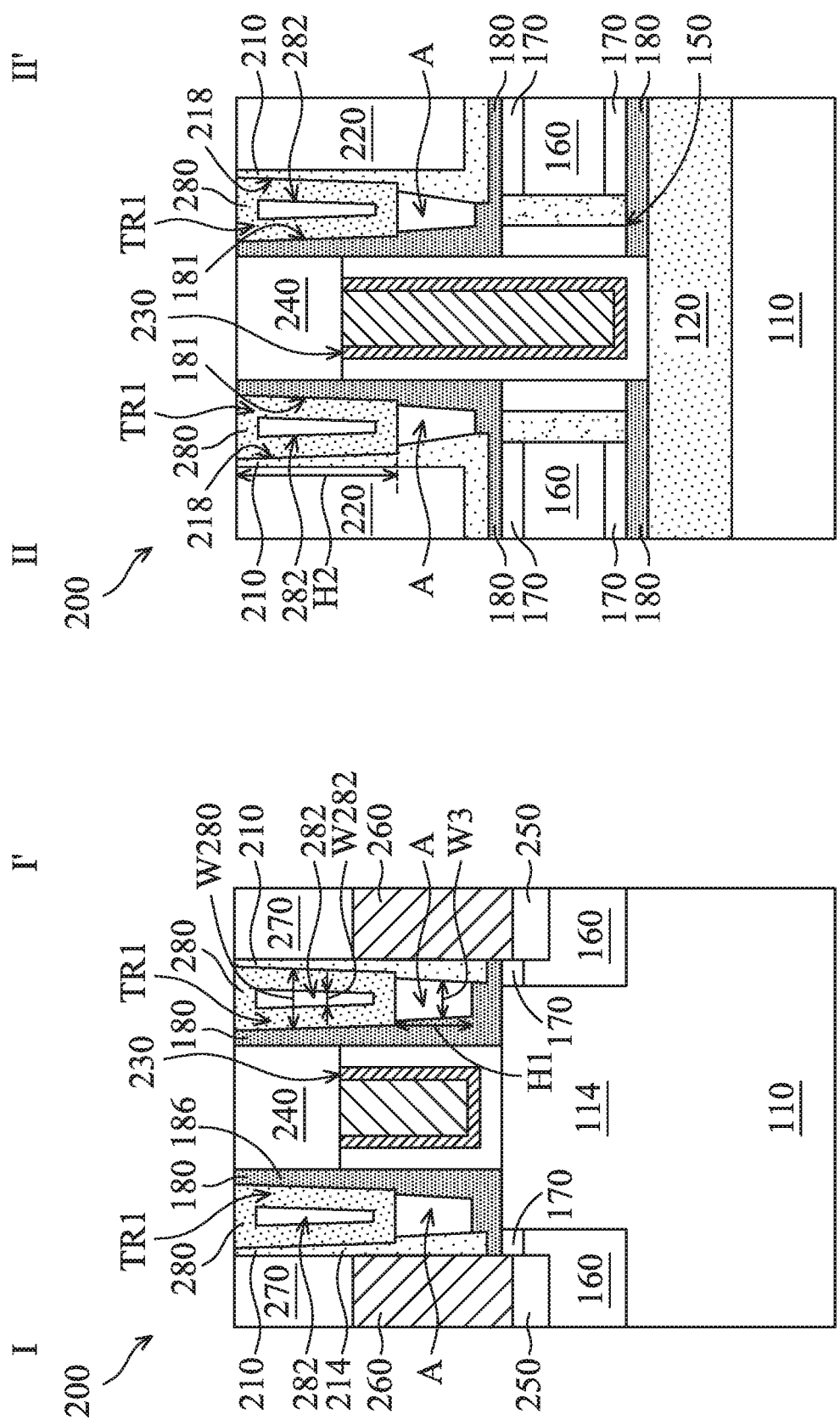

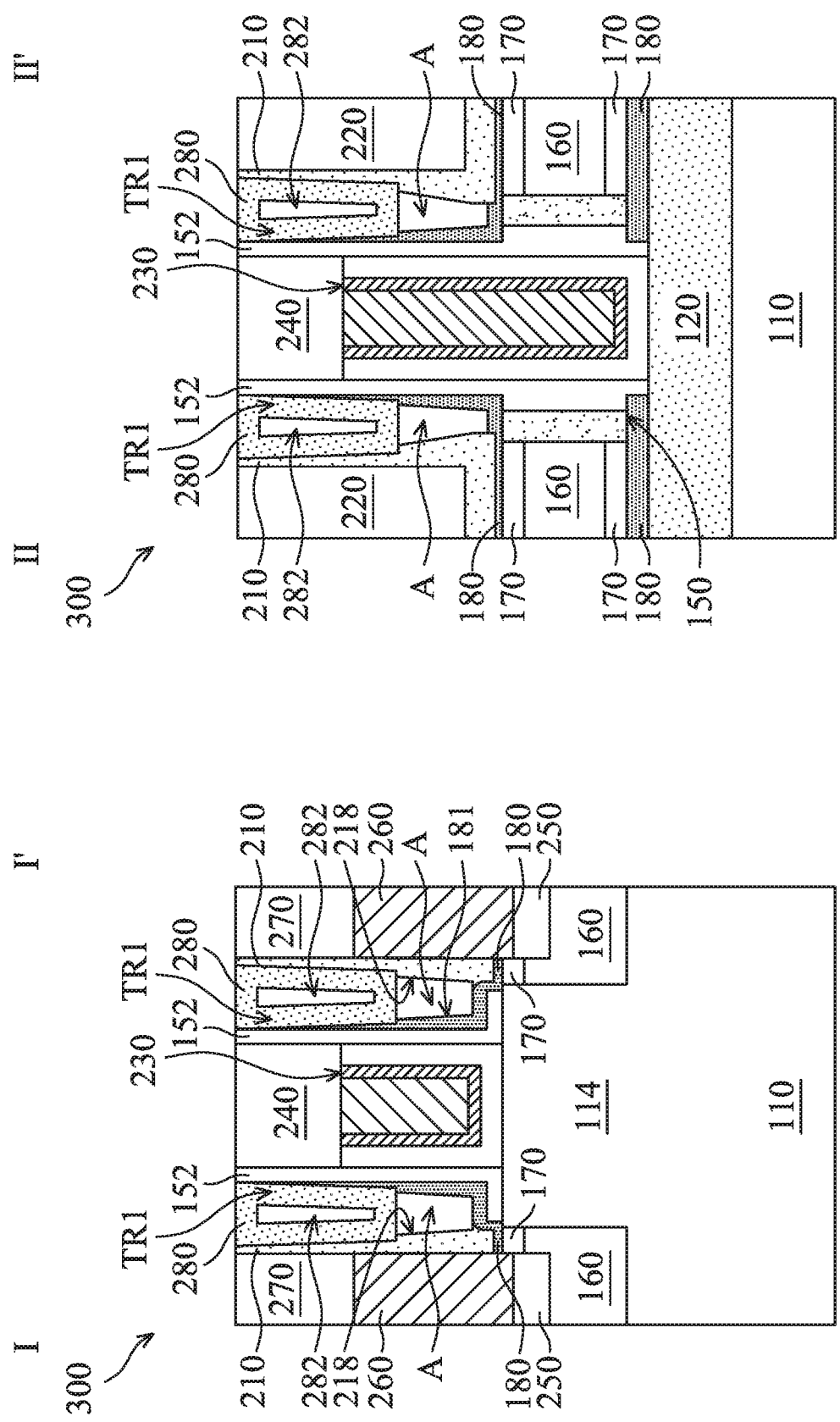

SEMICONDUCTOR DEVICE STRUCTURE AND METHOD FOR FORMING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIGS. 1A-1F are perspective views of various stages of a process for forming a semiconductor device structure, in accordance with some embodiments.

FIG. 1F-1 is a top view of the semiconductor device structure of FIG. 1F, in accordance with some embodiments.

FIGS. 2A-1 to 2K-1 are cross-sectional views of various stages of a process for forming a semiconductor device structure, in accordance with some embodiments.

FIGS. 2A-2 to 2K-2 are cross-sectional views of various stages of a process for forming a semiconductor device structure, in accordance with some embodiments.

FIG. 2K-3 is a top view of the semiconductor device structure of FIG. 2K-1, in accordance with some embodiments.

FIG. 2K-4 is a cross-sectional view illustrating the semiconductor device structure along a sectional line III-III' in FIG. 2K-3, in accordance with some embodiments.

FIGS. 3A-1 to 3G-1 are cross-sectional views of various stages of a process for forming a semiconductor device structure, in accordance with some embodiments.

FIGS. 3A-2 to 3G-2 are cross-sectional views of various stages of a process for forming a semiconductor device structure, in accordance with some embodiments.

FIG. 3G-3 is a top view of the semiconductor device structure of FIG. 3G-1, in accordance with some embodiments.

FIG. 3G-4 is a cross-sectional view illustrating the semiconductor device structure along a sectional line III-III' in FIG. 3G-3, in accordance with some embodiments.

DETAILED DESCRIPTION

Figure 1B:
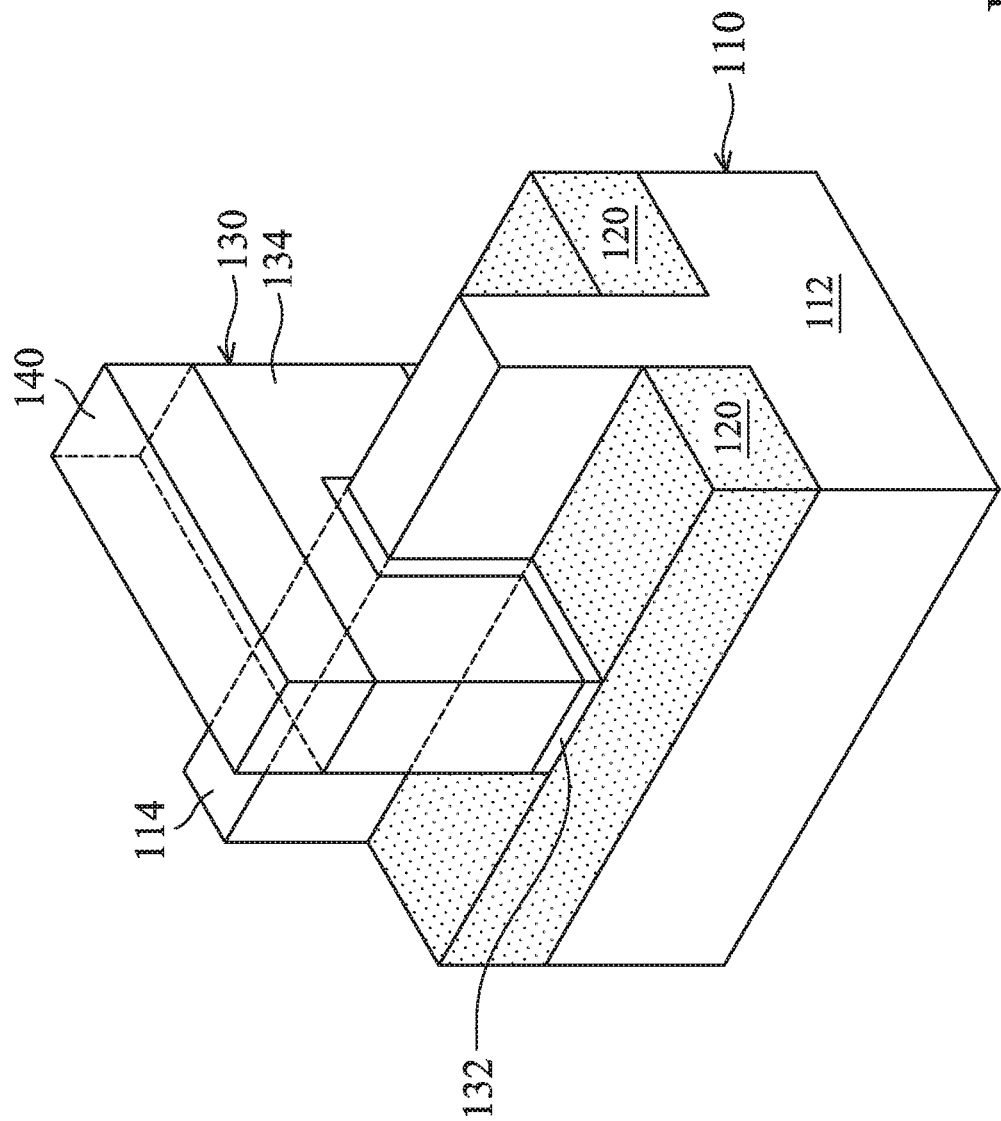

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure form a semiconductor device structure with FinFETs. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIGS. 1A-1F are perspective views of various stages of a process for forming a semiconductor device structure, in accordance with some embodiments. As shown in FIG. 1A, a substrate 110 is provided, in accordance with some embodiments. The substrate 110 has a base 112 and a fin 114, in accordance with some embodiments. The fin 114 is over the base 112, in accordance with some embodiments.

The substrate 110 includes, for example, a semiconductor substrate. The semiconductor substrate includes, for example, a semiconductor wafer (such as a silicon wafer) or a portion of a semiconductor wafer. In some embodiments, the substrate 110 is made of an elementary semiconductor material including silicon or germanium in a single crystal, polycrystal, or amorphous structure.

In some other embodiments, the substrate 110 is made of a compound semiconductor, such as silicon carbide, gallium arsenide, gallium phosphide, indium phosphide, indium arsenide, an alloy semiconductor, such as SiGe, or GaAsP, or a combination thereof. The substrate 110 may also include multi-layer semiconductors, semiconductor on insulator (SOI) (such as silicon on insulator or germanium on insulator), or a combination thereof.

As shown in FIG. 1A, an isolation layer 120 is formed over the base 112, in accordance with some embodiments. The fin 114 is partially in the isolation layer 120, in accordance with some embodiments. The isolation layer 120 surrounds a lower portion of the fin 114, in accordance with some embodiments. The isolation layer 120 includes oxide (such as silicon oxide), in accordance with some embodiments. The isolation layer 120 is formed by a chemical vapor deposition (CVD) process and an etching back process, in accordance with some embodiments.

As shown in FIG. 1B, a gate stack 130 and a mask layer 140 are formed over the fin 114 and the isolation layer 120, in accordance with some embodiments. The gate stack 130 wraps around an upper portion of the fin 114, in accordance with some embodiments. The gate stack 130 includes a gate dielectric layer 132 and a gate electrode 134, in accordance with some embodiments.

The gate dielectric layer 132 conformally covers the fin structure 114 and the isolation layer 120, in accordance with some embodiments. The gate dielectric layer 132 is in direct contact with the fin structure 114 and the isolation layer 120, in accordance with some embodiments. The gate dielectric layer 132 is made of an insulating material, such as an oxide-containing material (e.g. $SiO_2$), in accordance with some embodiments.

The gate electrode 134 is over the gate dielectric layer 132, in accordance with some embodiments. The gate electrode 134 is in direct contact with the gate dielectric layer 132, in accordance with some embodiments. The gate electrode 134 is made of a semiconductor material, such as polysilicon, in accordance with some embodiments.

The mask layer 140 is positioned over the gate stack 130, in accordance with some embodiments. The mask layer 140 may be made of or include silicon nitride, silicon oxynitride, carbon-containing silicon nitride, carbon-containing silicon oxynitride, carbon-containing silicon oxide, one or more other suitable materials, or a combination thereof.

Figure 1C:
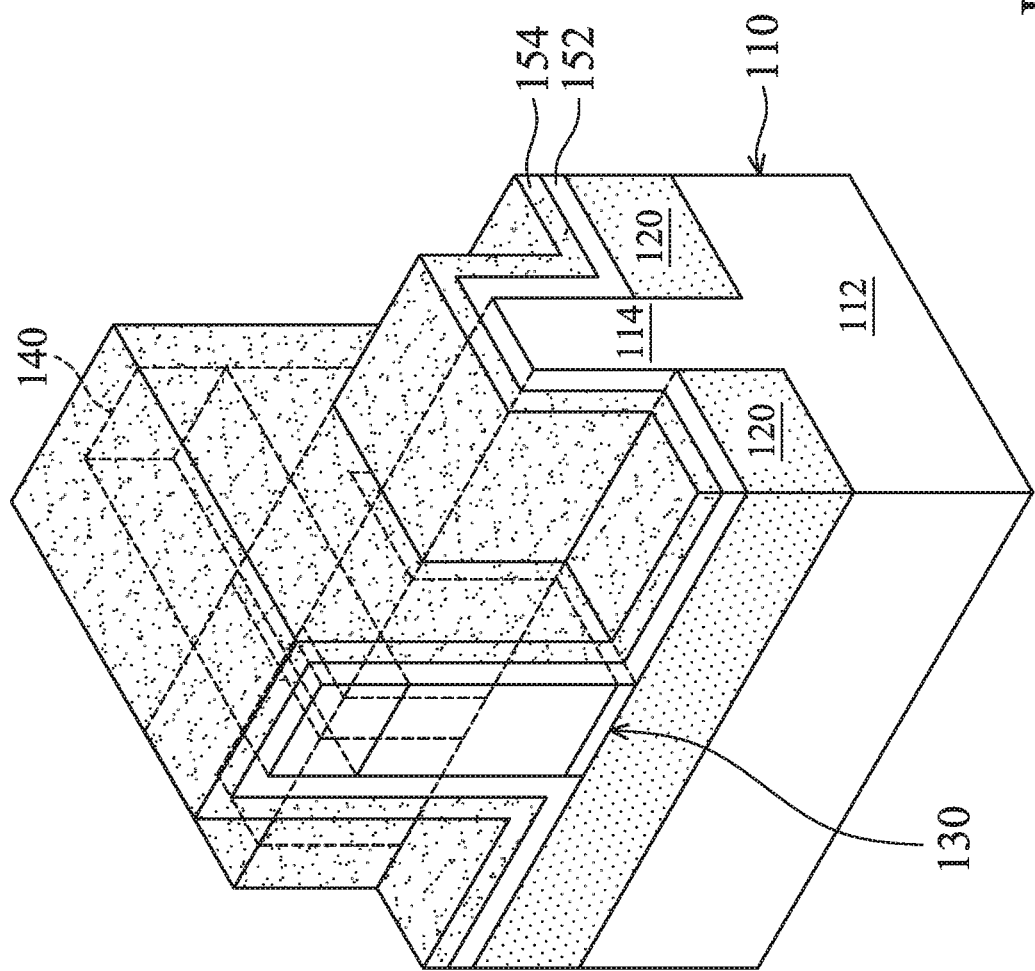

As shown in FIG. 1C, a spacer layer 152 is conformally formed over the gate stack 130, the mask layer 140, the isolation layer 120, and the fin 114, in accordance with some embodiments. The spacer layer 152 is made of an insulating material such as oxides (e.g., $SiO_2$, SiOC, SiON, SiOCN, ZrO, $HfO_2$, $Al_2O_3$ or AlON), nitrides (e.g., SiN, SiCN or ZrN), carbides (e.g., SiC) or a high dielectric constant (high-k) material, in accordance with some embodiments.

The high-k material is made of metal oxides, such as hafnium oxide ($HfO_2$), hafnium silicon oxide (HfSiO), hafnium silicon oxynitride (HfSiON), hafnium tantalum oxide (HfTaO), hafnium titanium oxide (HTiO), hafnium zirconium oxide (HfZrO), aluminum oxide, hafnium dioxide-alumina ($HfO_2$—$Al_2O_3$) alloy, or combinations thereof, in accordance with some embodiments. In some other embodiments, the high-k material is made of metal nitrides, metal silicates, transition metal-oxides, transition metal-nitrides, transition metal-silicates, oxynitrides of metals, other suitable materials, or combinations thereof.

As shown in FIG. 1C, a spacer layer 154 is conformally formed over the spacer layer 152, in accordance with some embodiments. The spacer layers 152 and 154 are made of different materials, in accordance with some embodiments. The spacer layer 154 is made of an insulating material such as oxides (e.g., $SiO_2$, SiOC, SiON, SiOCN, ZrO, $HfO_2$, $Al_2O_3$ or AlON), nitrides (e.g., SiN, SiCN or ZrN), carbides (e.g., SiC) or a high dielectric constant (high-k) material, in accordance with some embodiments.

The high-k material is made of metal oxides, such as hafnium oxide ($HfO_2$), hafnium silicon oxide (HfSiO), hafnium silicon oxynitride (HfSiON), hafnium tantalum oxide (HfTaO), hafnium titanium oxide (HTiO), hafnium zirconium oxide (HfZrO), aluminum oxide, hafnium dioxide-alumina ($HfO_2$—$Al_2O_3$) alloy, or combinations thereof, in accordance with some embodiments. In some other embodiments, the high-k material is made of metal nitrides, metal silicates, transition metal-oxides, transition metal-nitrides, transition metal-silicates, oxynitrides of metals, other suitable materials, or combinations thereof.

Figure 1D:
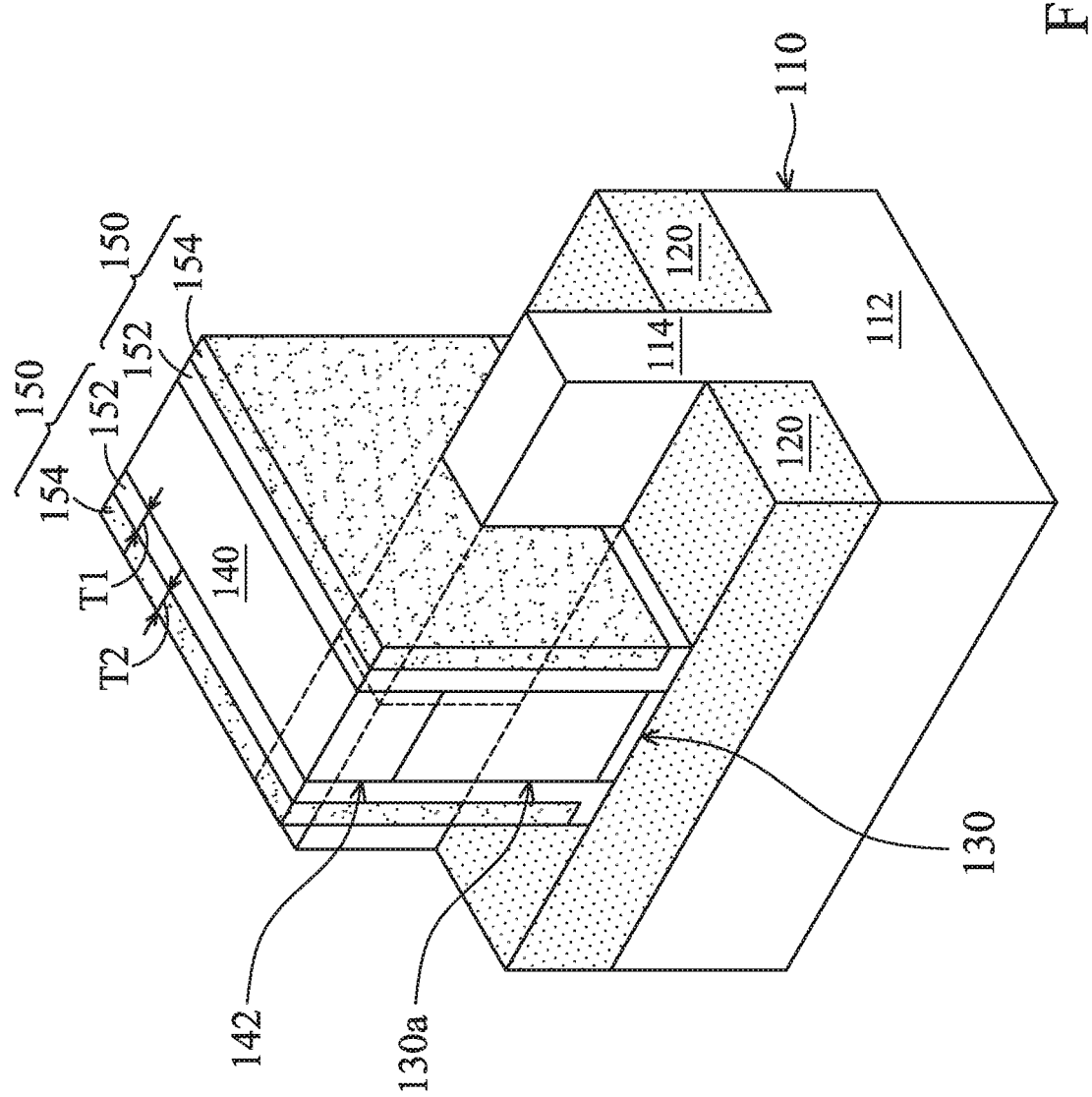

As shown in FIG. 1D, the spacer layers 152 and 154 over the mask layer 140, the fin 114, and a portion of the isolation layer 120 are removed, in accordance with some embodiments. The remaining spacer layers 152 and 154 remain over sidewalls 130a and 142 of the gate stack 130 and the mask layer 140, in accordance with some embodiments. The remaining spacer layers 152 and 154 together form a spacer structure 150, in accordance with some embodiments.

The spacer layer 152 has a thickness T1 ranging from about 0.5 nm to about 10 nm, in accordance with some embodiments. The spacer layer 154 has a thickness T2 ranging from about 0.5 nm to about 10 nm, in accordance with some embodiments. The removal process includes an anisotropic etching process such as a dry etching process (e.g., a plasma etching process), in accordance with some embodiments.

Figure 1E:
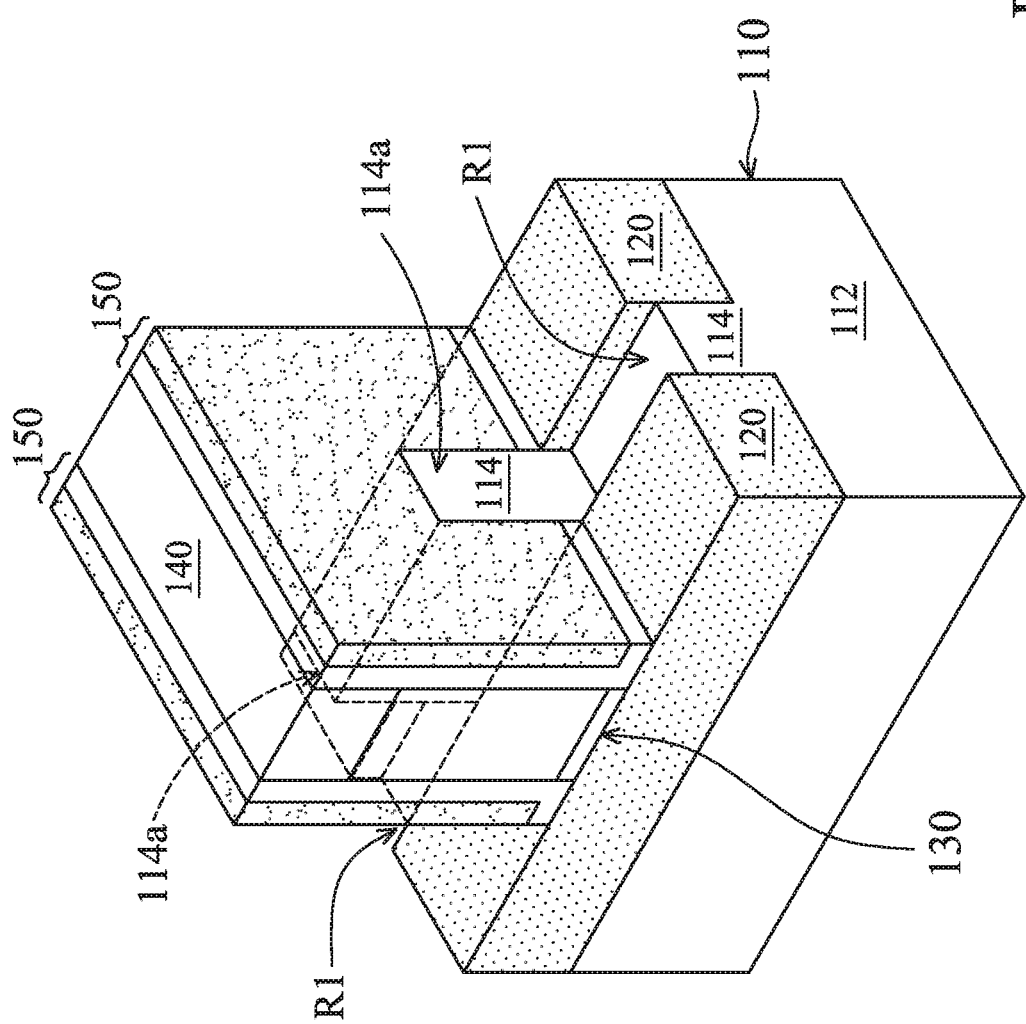

As shown in FIG. 1E, the fin 114 exposed by the gate stack 130 and the spacer structure 150 is partially removed, in accordance with some embodiments. The removal process forms recesses R1 in the fin 114, in accordance with some embodiments. The fin 114 wrapped by the gate stack 130 has opposite sides 114a, in accordance with some embodiments.

Figure 1F:
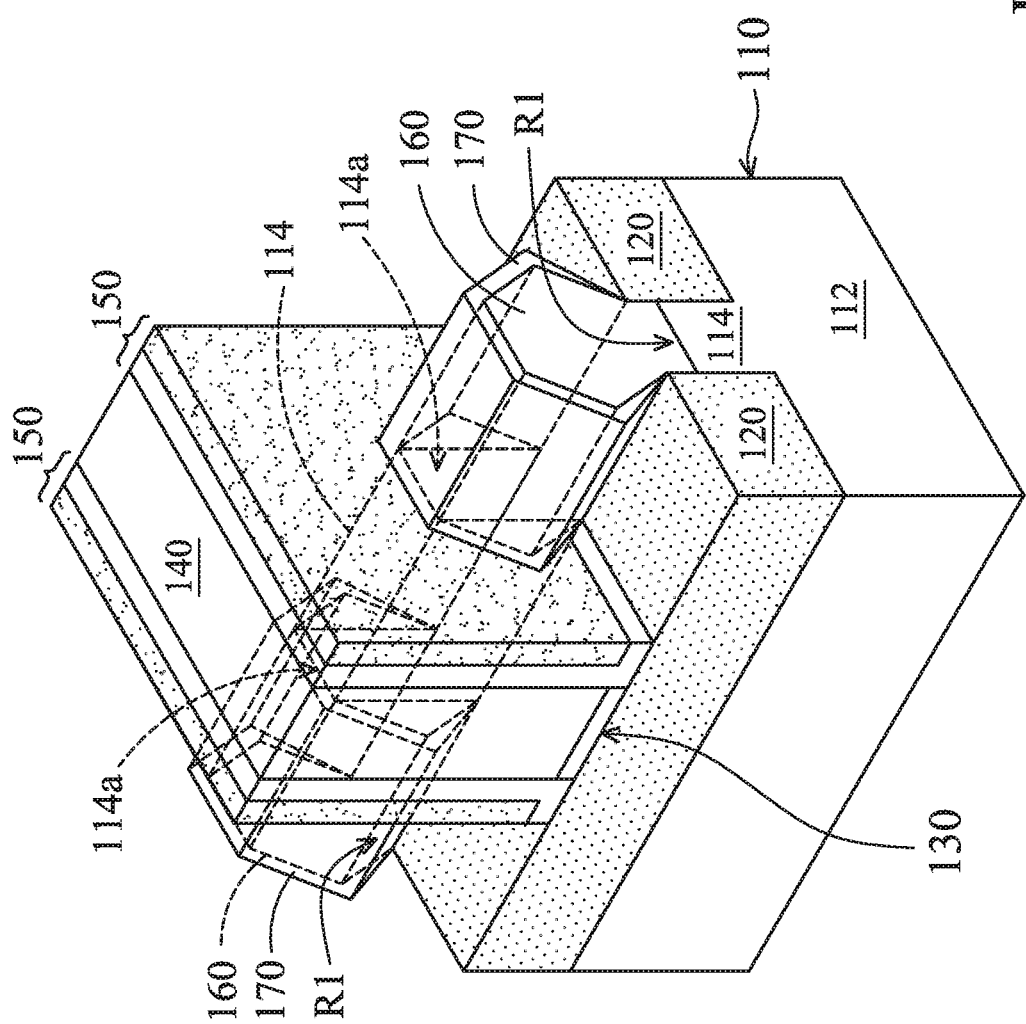
Figures 1, 1F:
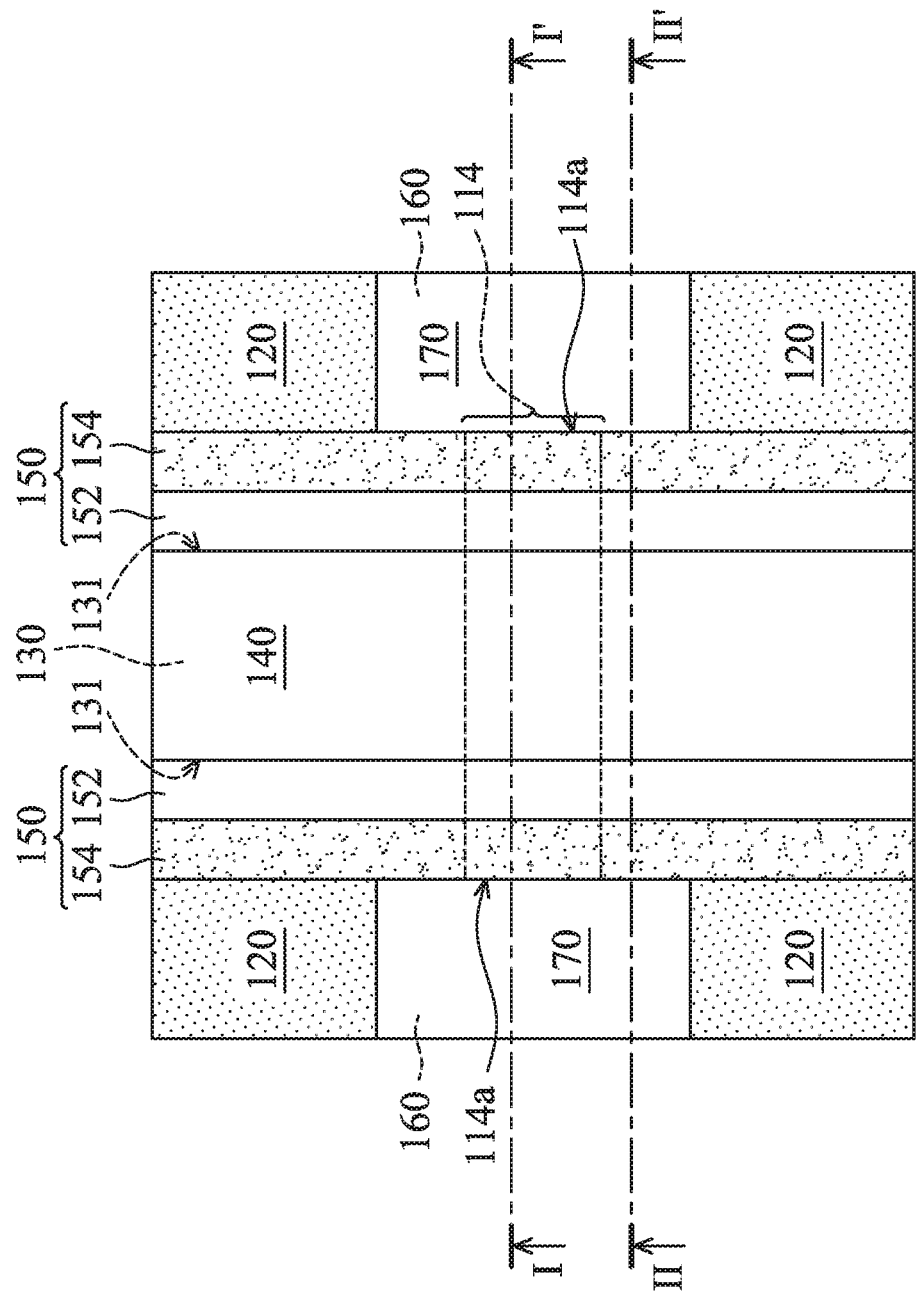
Figures 1, 2, 2B:
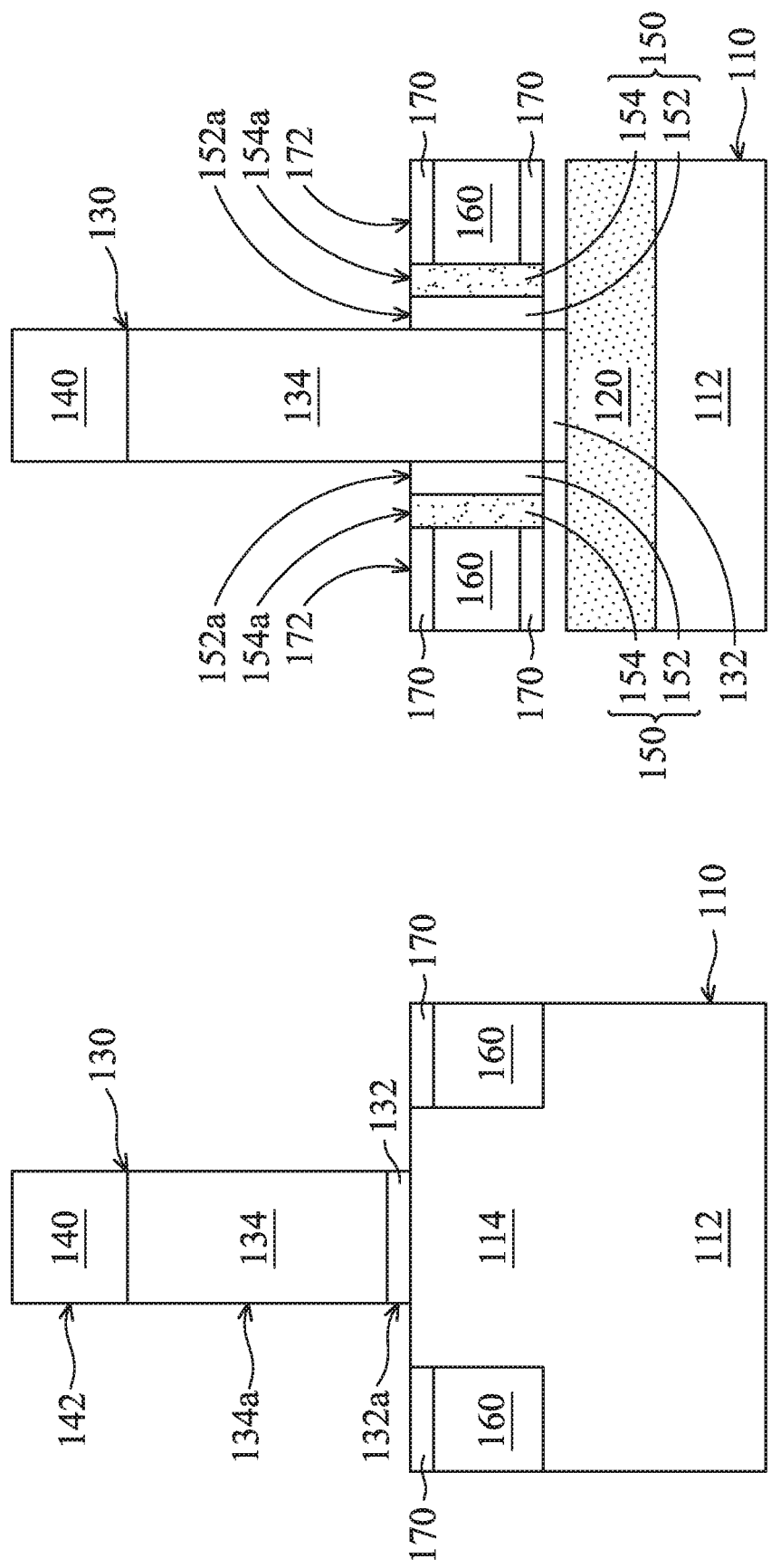

FIG. 1F-1 is a top view of the semiconductor device structure of FIG. 1F, in accordance with some embodiments. FIG. 2A-1 is a cross-sectional view illustrating the semiconductor device structure along a sectional line I-I' in FIG. 1F-1, in accordance with some embodiments. FIG. 2A-2 is a cross-sectional view illustrating the semiconductor device structure along a sectional line II-II' in FIG. 1F-1, in accordance with some embodiments.

As shown in FIGS. 1F, 1F-1, 2A-1, and 2A-2, stressors 160 are respectively formed in the recesses R1 and over the opposite sides 114a of the fin 114, in accordance with some embodiments. The stressors 160 are in direct contact with the fin 114, in accordance with some embodiments. The stressors 160 are respectively located over opposite sides 131 of the gate stack 130, in accordance with some embodiments.

In some embodiments, a portion of the spacer structure 150 is between the gate stack 130 and the stressors 160. The stressors 160 include a source structure and a drain structure, in accordance with some embodiments. The stressor 160 has a thickness T3 ranging from about 1 nm to about 30 nm, in accordance with some embodiments.

The stressors 160 are made of an N-type conductivity material, in accordance with some embodiments. The N-type conductivity material includes silicon, silicon phosphorus (SiP), silicon carbide (SiC), silicon phosphorus carbide (SiPC), group III-V compounds, or another suitable N-type conductivity material. The group III-V compounds include InP, GaAs, AlAs, InAs, InAlAs, or InGaAs, in accordance with some embodiments.

In some other embodiments, the stressors 160 are made of a P-type conductivity material, in accordance with some embodiments. The P-type conductivity material includes silicon, silicon germanium (SiGe), boron-doped silicon germanium (SiGeB), germanium, group III-V compounds, or another suitable P-type conductivity material. The group III-V compounds include InSb, GaSb, or InGaSb, in accordance with some embodiments. The stressors 160 are doped with the Group IIIA element, in accordance with some embodiments. The Group IIIA element includes boron or another suitable material. The stressors 160 are formed using an epitaxial process, in accordance with some embodiments.

As shown in FIGS. 1F, 1F-1, 2A-1, and 2A-2, a cap layer 170 is formed over the stressors 160, in accordance with some embodiments. The cap layer 170 conformally covers the stressors 160, in accordance with some embodiments. In some embodiments, a portion of the spacer structure 150 is between the gate stack 130 and the cap layer 170.

The cap layer 170 has a thickness T4 ranging from about 0.5 nm to about 10 nm, in accordance with some embodiments. The cap layer 170 is made of silicon, a silicon containing material (e.g., SiO, SiN, SiC, SiCN, SiOC, SiON, SiCN, or SiOCN), a metal oxide material (e.g., ZrO, $Al_2O_3$, $HfO_2$ or AlON), nitrides (e.g., ZrN), or a high-k material, in accordance with some embodiments.

The high-k material is made of metal oxides, such as hafnium oxide ($HfO_2$), hafnium silicon oxide (HfSiO), hafnium silicon oxynitride (HfSiON), hafnium tantalum oxide (HfTaO), hafnium titanium oxide (HTiO), hafnium zirconium oxide (HfZrO), aluminum oxide, hafnium dioxide-alumina ($HfO_2$—$Al_2O_3$) alloy, or combinations thereof, in accordance with some embodiments.

In some other embodiments, the high-k material is made of metal nitrides, metal silicates, transition metal-oxides, transition metal-nitrides, transition metal-silicates, oxynitrides of metals, other suitable materials, or combinations thereof. The cap layer 170 is formed using an epitaxial process or another suitable process, in accordance with some embodiments.

Figures 2, 2C:
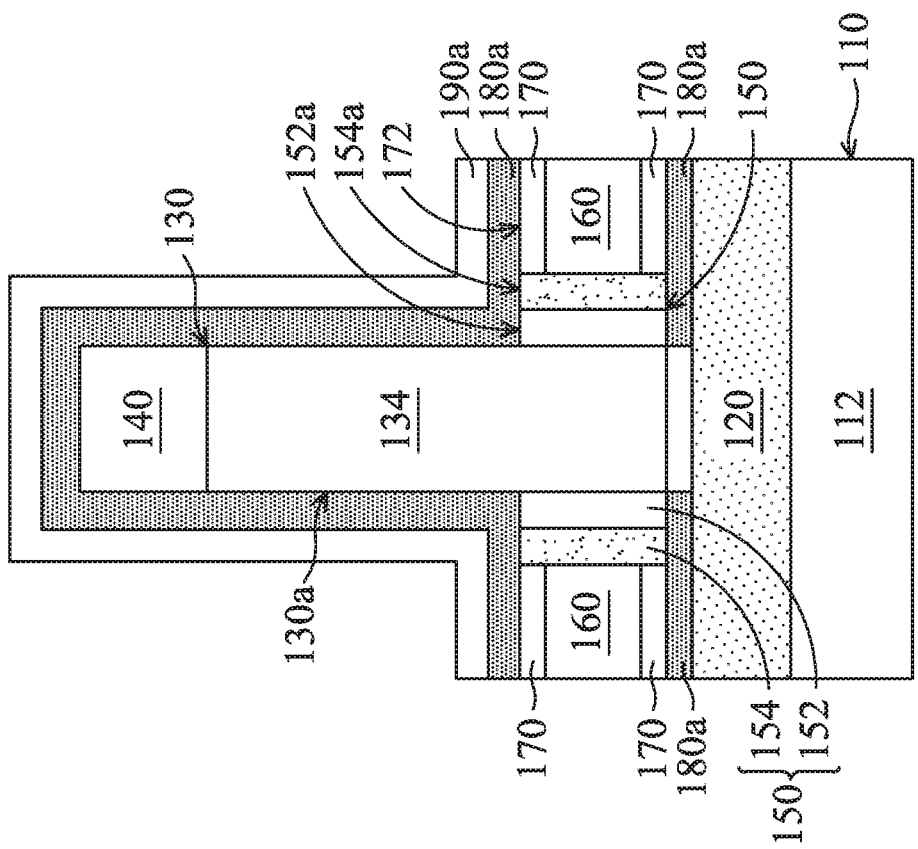
Figures 1, 2C:
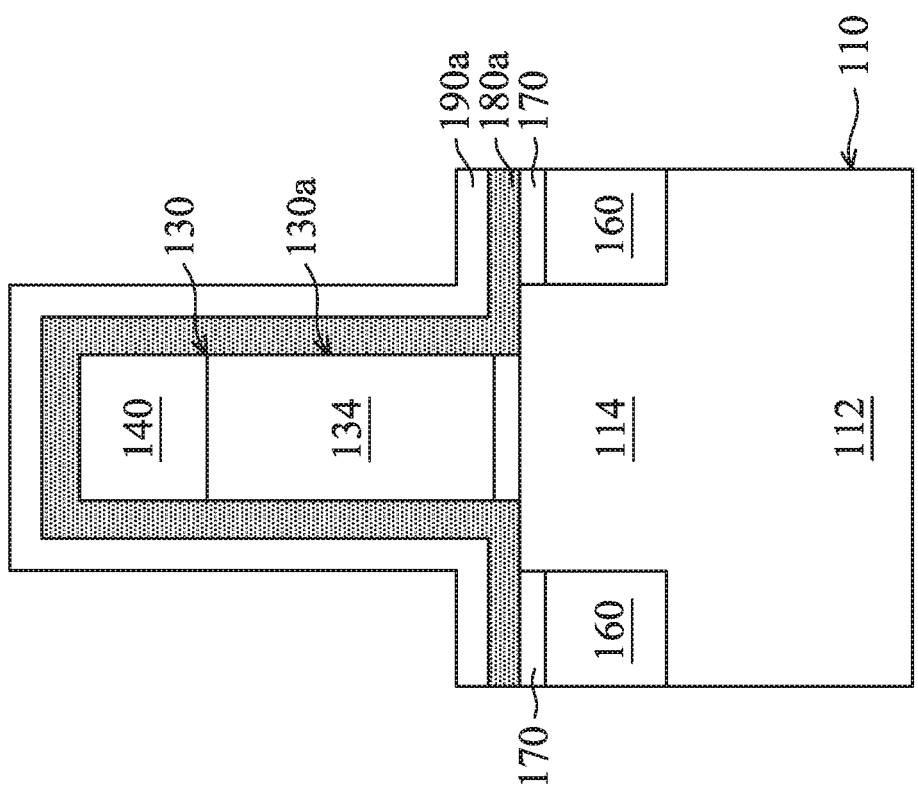
Figures 2, 2D:
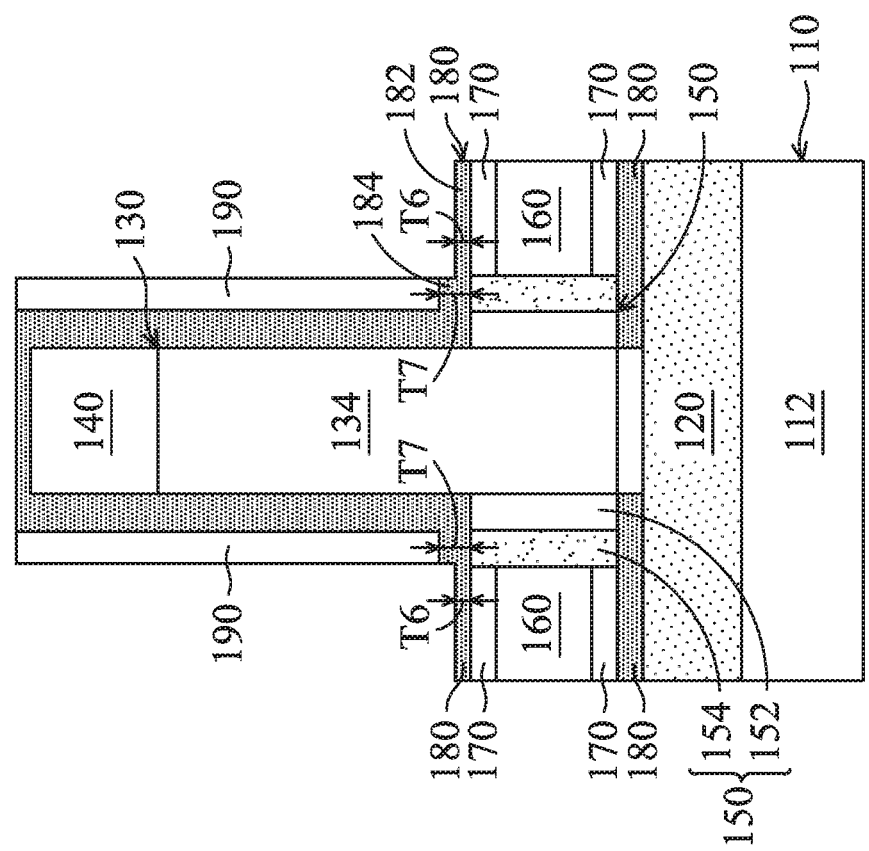
Figures 1, 2D:
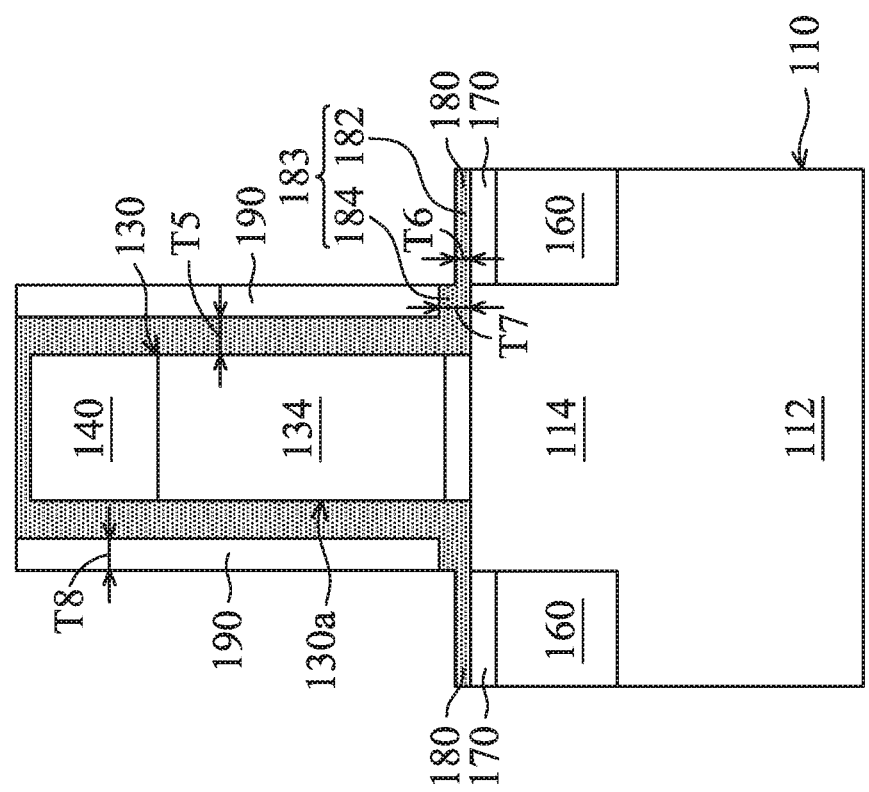
Figures 2, 2E:
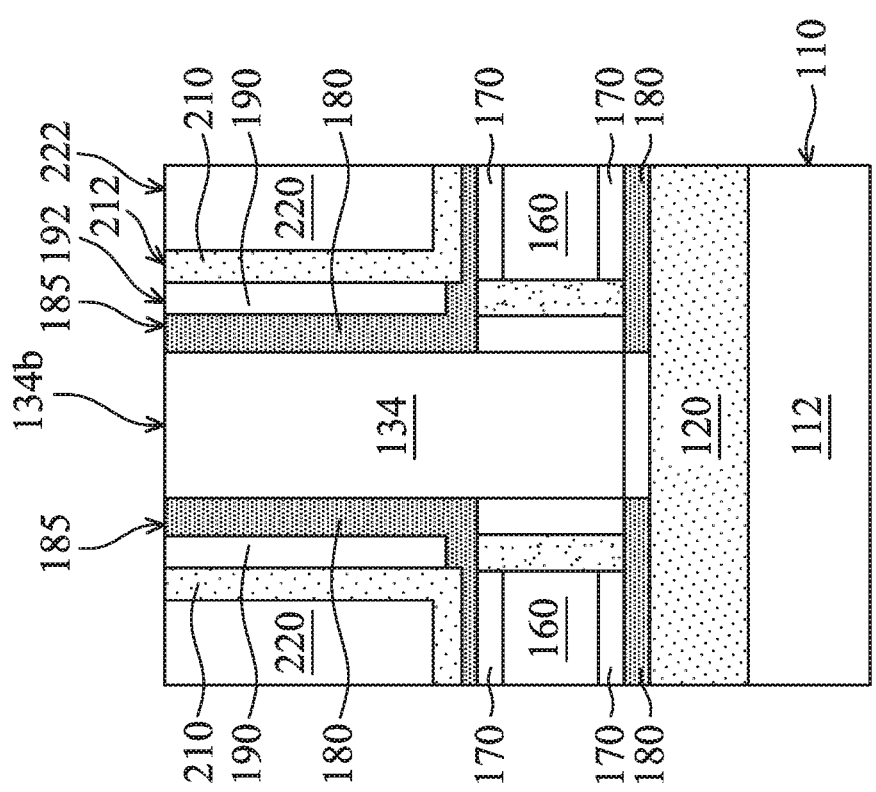
Figures 1, 2E:
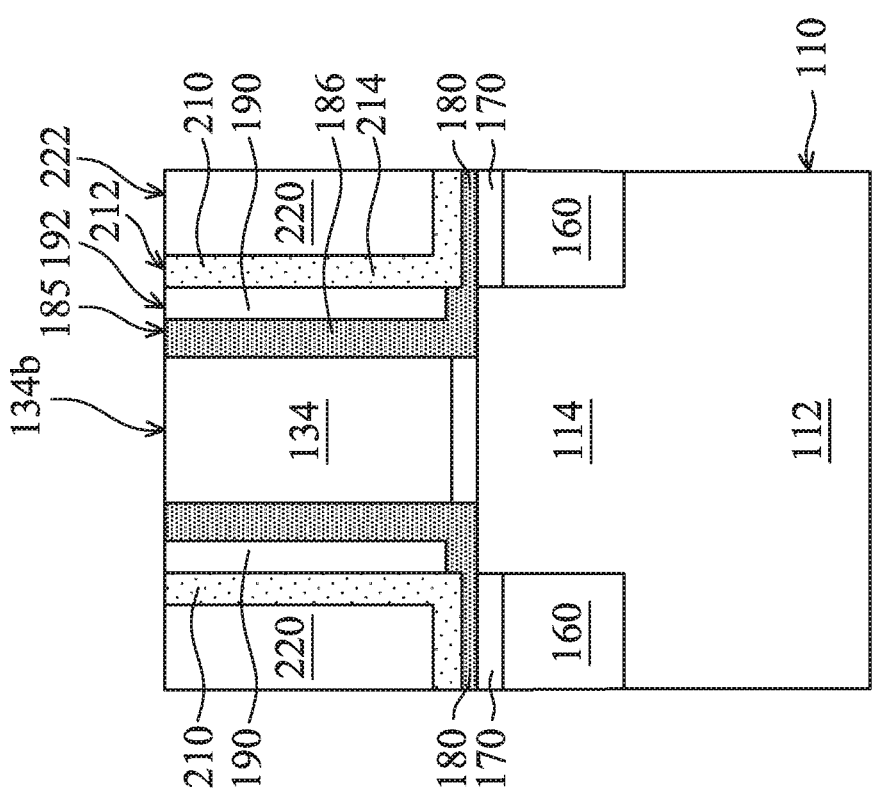
Figures 2, 2G:
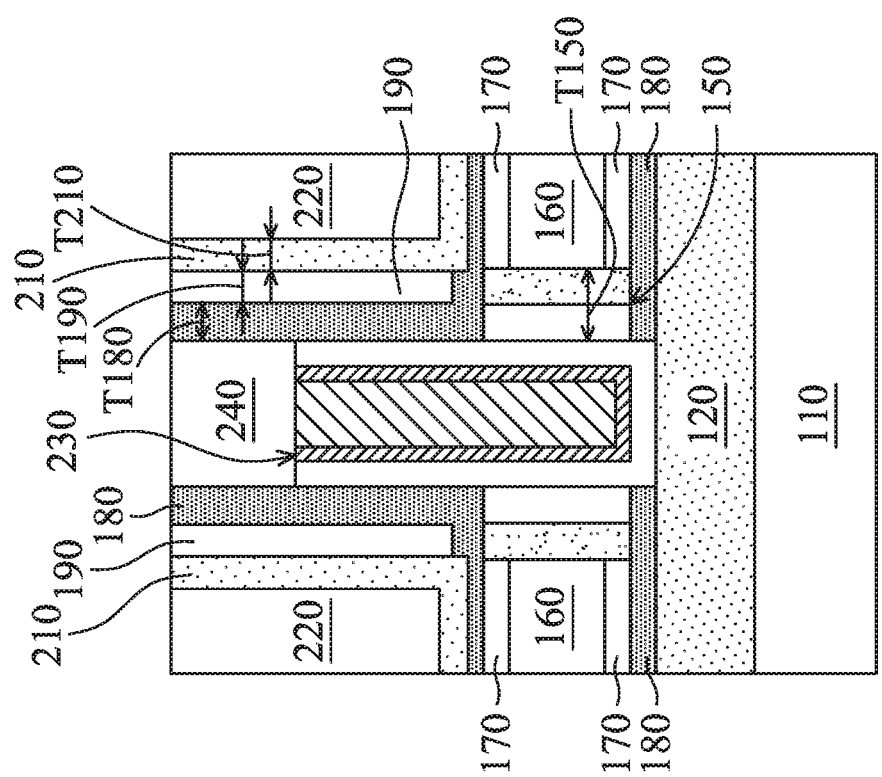
Figures 1, 2G:
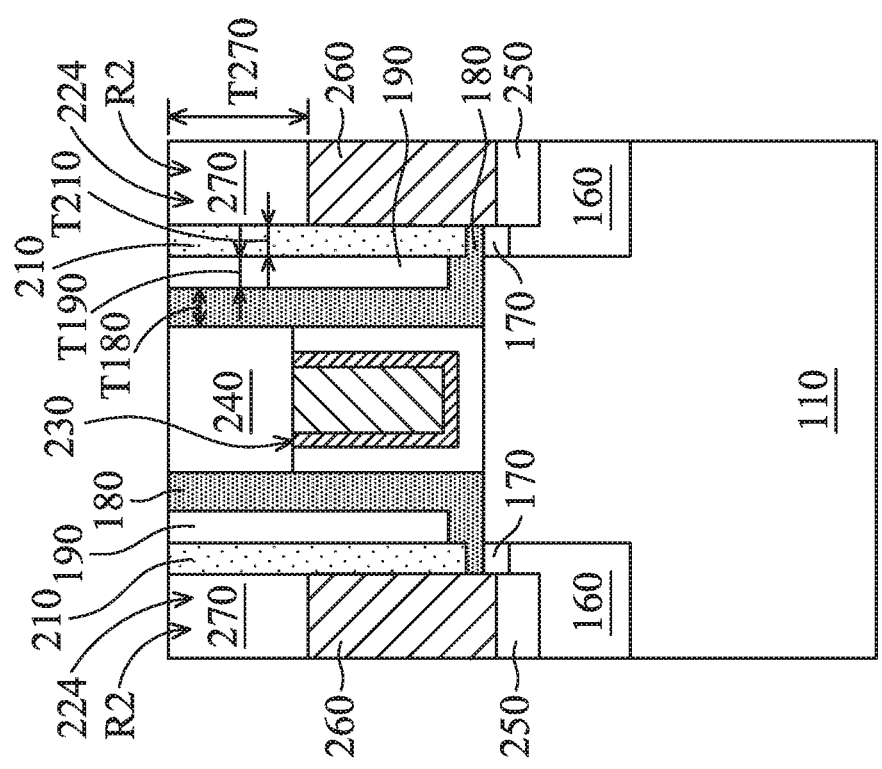
Figures 2, 2H:
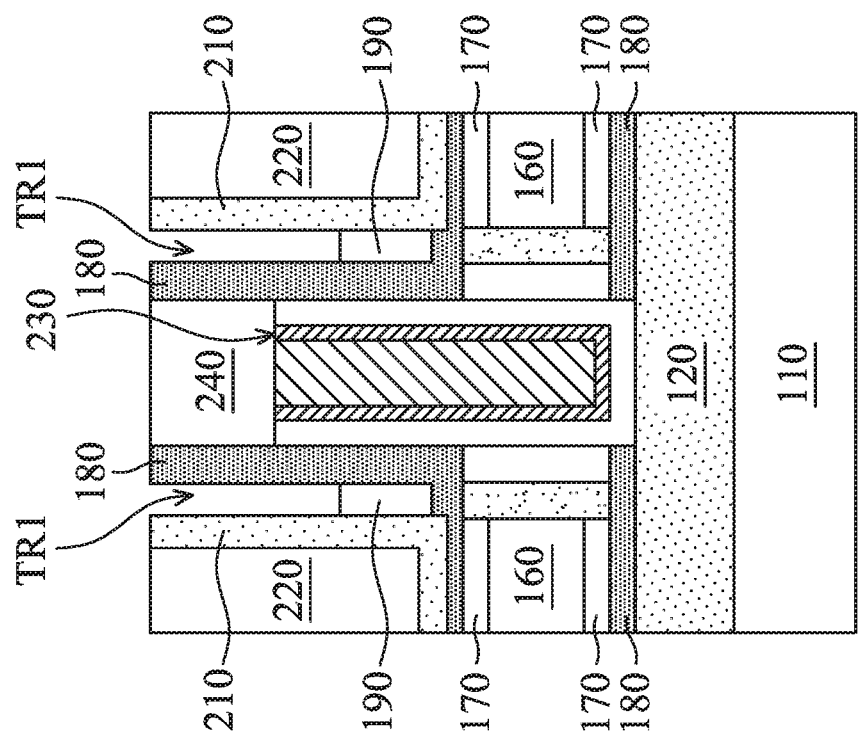
Figures 1, 2H:
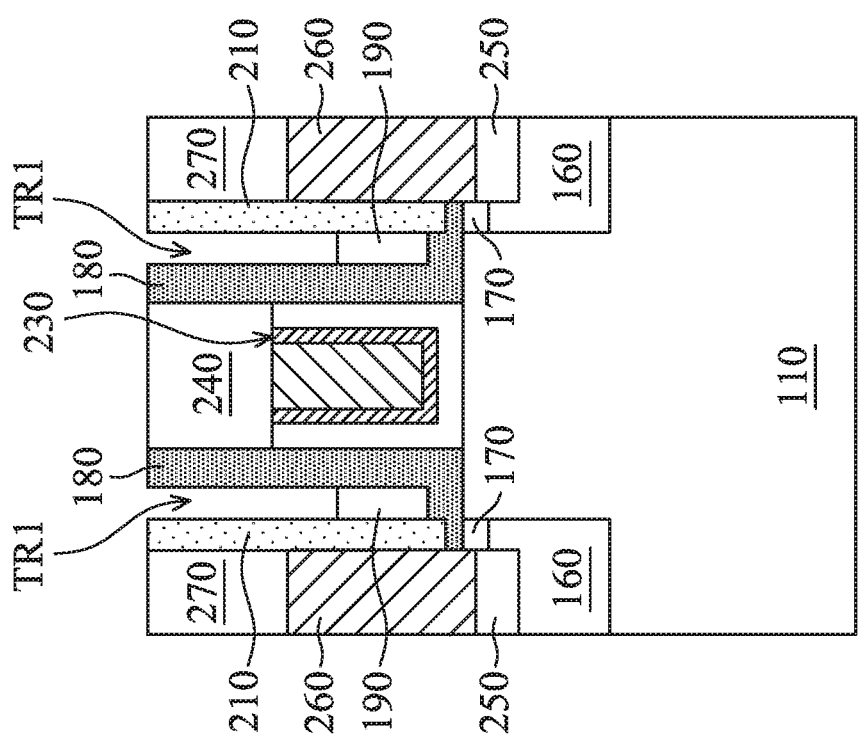
Figures 2, 2I:
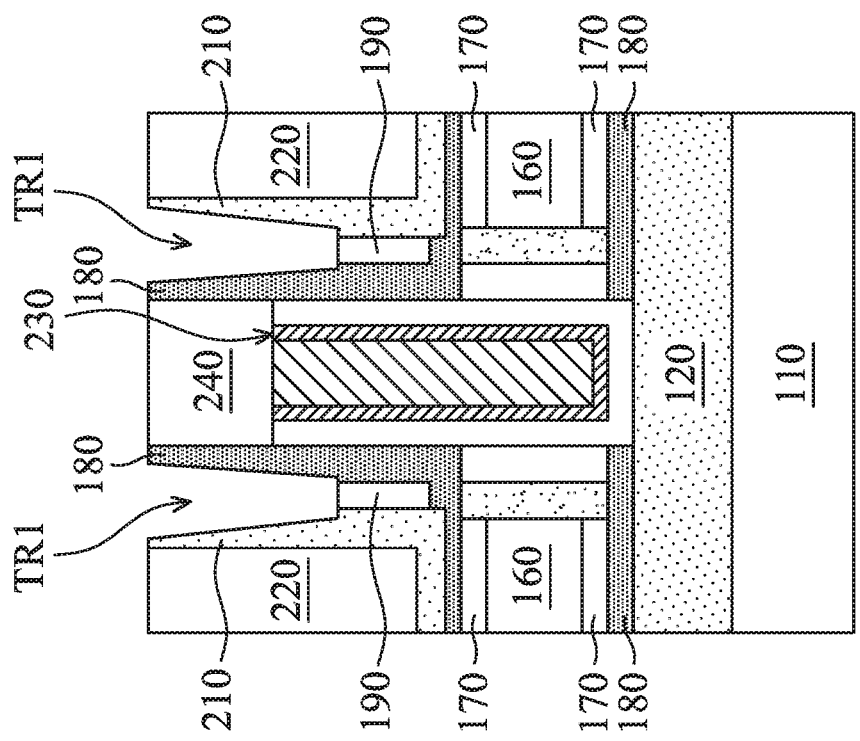
Figures 1, 2I:
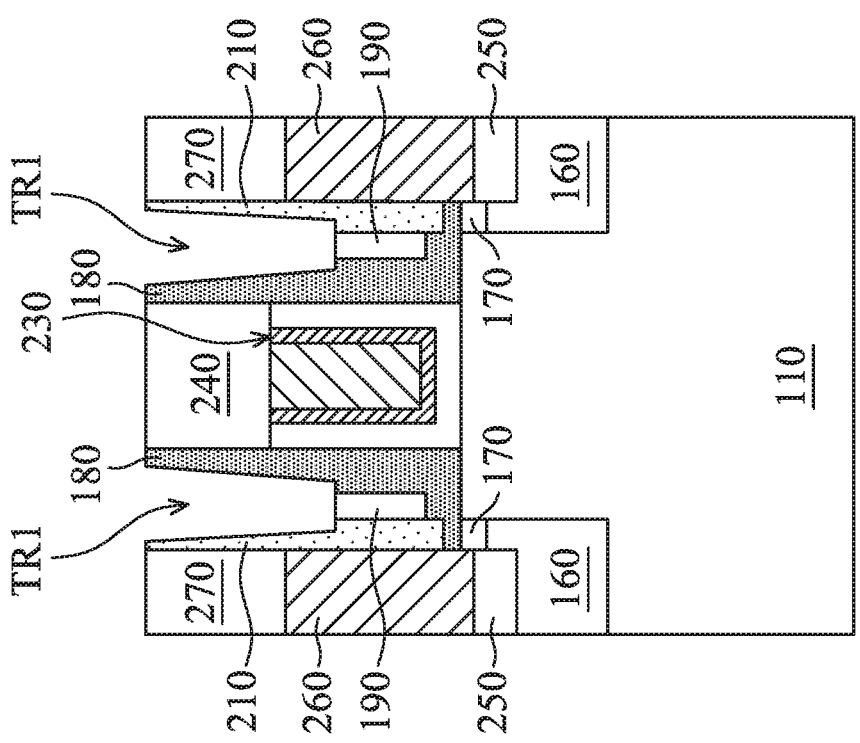
Figures 2, 2J:
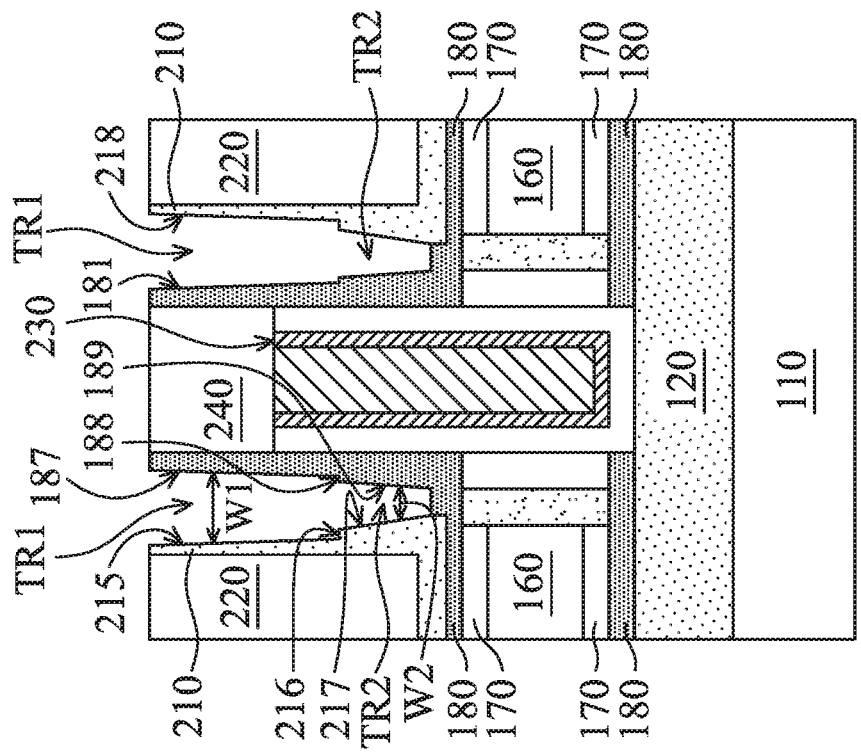
Figures 1, 2J:
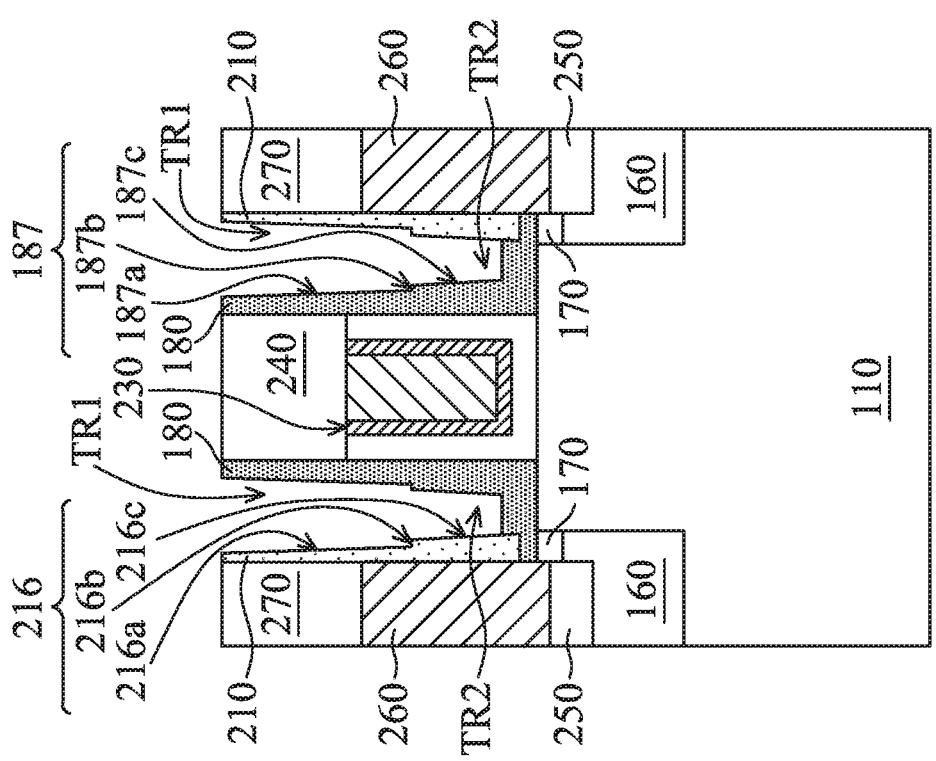
Figures 2, 2K, 3:
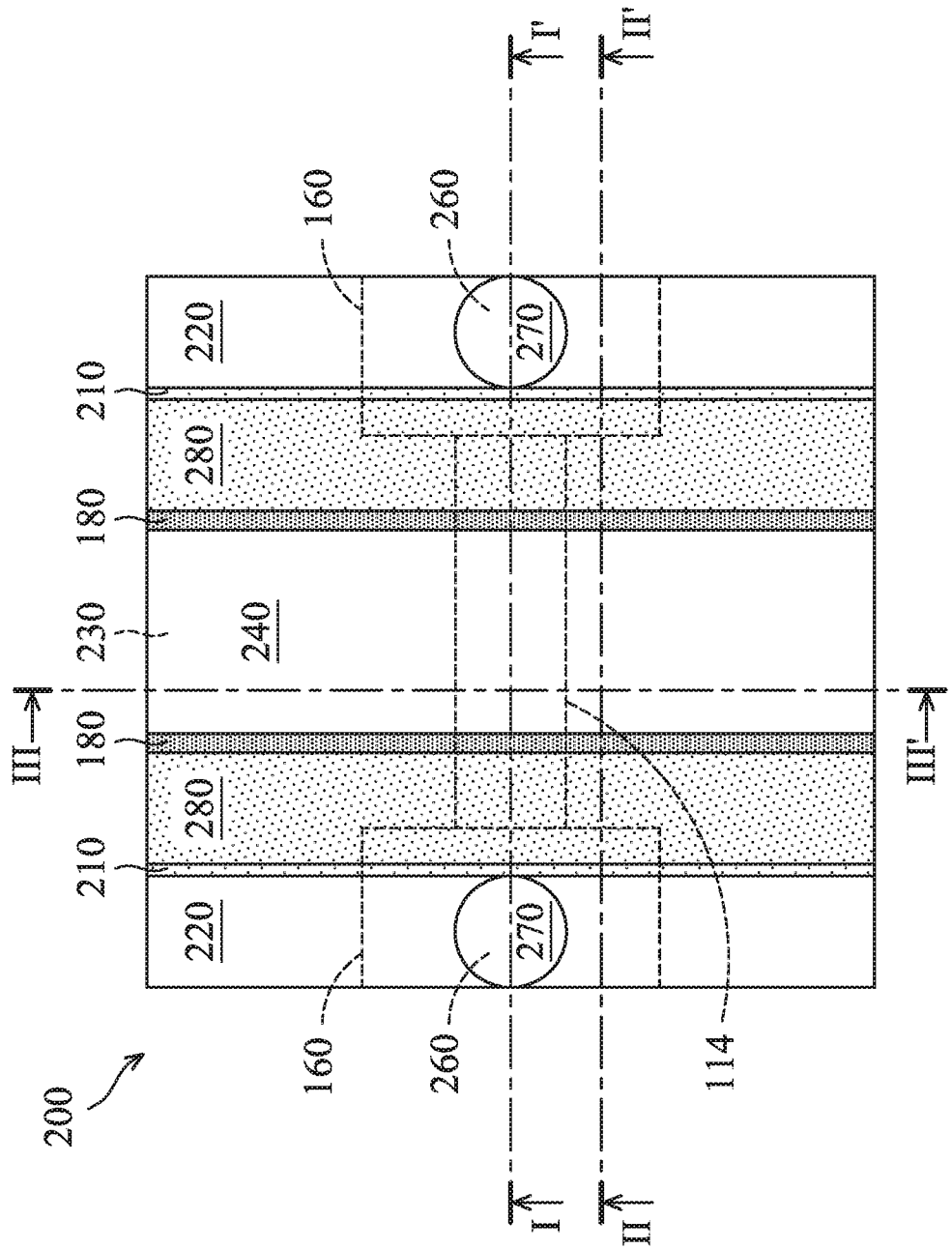

FIGS. 2A-1 to 2K-1 are cross-sectional views of various stages of a process for forming a semiconductor device structure, in accordance with some embodiments. FIGS. 2A-2 to 2K-2 are cross-sectional views of various stages of a process for forming the semiconductor device structure, in accordance with some embodiments.

As shown in FIGS. 2B-1 and 2B-2, the spacer structure 150 is removed except for the portion of the spacer structure 150 between the gate stack 130 and the stressors 160 and between the gate stack 130 and the cap layer 170, in accordance with some embodiments. After the removal process, the sidewalls 132a, 134a, and 142 of the gate dielectric layer 132, the gate electrode 134, and the mask layer 140 are exposed by the spacer structure 150, in accordance with some embodiments. The removal process includes a dry etching process such as a plasma etching process, in accordance with some embodiments.

As shown in FIGS. 2C-1 and 2C-2, a spacer material layer 180a is conformally formed over the cap layer 170, the mask layer 140, the gate stack 130, the fin 114, and the spacer structure 150, in accordance with some embodiments. The spacer material layer 180a is made of silicon, a silicon containing material (e.g., SiO, SiN, SiC, SiCN, SiOC, SiON, SiCN, or SiOCN), a metal oxide material (e.g., ZrO, $Al_2O_3$, $HfO_2$ or AlON), nitrides (e.g., ZrN), or a high-k material, in accordance with some embodiments.

The high-k material is made of metal oxides, such as hafnium oxide ($HfO_2$), hafnium silicon oxide (HfSiO), hafnium silicon oxynitride (HfSiON), hafnium tantalum oxide (HfTaO), hafnium titanium oxide (HTiO), hafnium zirconium oxide (HfZrO), aluminum oxide, hafnium dioxide-alumina ($HfO_2$—$Al_2O_3$) alloy, or combinations thereof, in accordance with some embodiments. In some other embodiments, the high-k material is made of metal nitrides, metal silicates, transition metal-oxides, transition metal-nitrides, transition metal-silicates, oxynitrides of metals, other suitable materials, or combinations thereof.

As shown in FIGS. 2C-1 and 2C-2, a spacer material layer 190a is conformally formed over the spacer material layer 180a, in accordance with some embodiments. The spacer material layers 180a and 190a are made of different materials, in accordance with some embodiments. In some embodiments, an etching selectivity between the spacer material layers 180a and 190a is large enough to remove one of them independently.

As shown in FIGS. 2C-1, 2C-2, 2D-1 and 2D-2, the spacer material layer 190a over the mask layer 140 and the stressors 160 is removed, in accordance with some embodiments. Specifically, the spacer material layer 190a over level surfaces of the spacer material layer 180a is removed, in accordance with some embodiments. After the removal process, the patterned spacer material layer 190a forms a spacer layer 190, in accordance with some embodiments.

The spacer layer 190 has a thickness T8 ranging from about 0.5 nm to about 10 nm, in accordance with some embodiments.

The removal process further partially removes the spacer material layer 180a exposed by the spacer layer 190, in accordance with some embodiments. Specifically, the removal process partially removes upper portions of the spacer material layer 180a over the stressors 160 and the mask layer 140, in accordance with some embodiments. After the removal process, the patterned spacer material layer 180a forms a spacer layer 180, in accordance with some embodiments.

The spacer layer 180 covers the sidewall 130a of the gate stack 130, the fin 114, the spacer structure 150, the stressors 160, and the cap layer 170, in accordance with some embodiments. The spacer layer 180 over the sidewall 130a has a thickness T5 ranging from about 0.5 nm to about 10 nm, in accordance with some embodiments.

The spacer layer 180 has a stair shaped structure 183 having steps 182 and 184, in accordance with some embodiments. The step 184 is under the spacer layer 190, in accordance with some embodiments. The step 184 is thicker than the step 182, in accordance with some embodiments. The step 182 has a thickness T6 ranging from about 0.5 nm to about 5 nm, in accordance with some embodiments.

The step 184 has a thickness T7 ranging from about 0.5 nm to about 10 nm, in accordance with some embodiments. The removal process includes a dry etching process such as an anisotropic etching process (e.g., a plasma etching process), in accordance with some embodiments.

Thereafter, an etch stop material layer (not shown) is deposited over the spacer layers 180 and 190, in accordance with some embodiments. The etch stop material layer may be made of or include silicon nitride, silicon oxynitride, one or more other suitable materials, or a combination thereof. The etch stop material layer may be deposited using a CVD process, an ALD process, a PECVD process, one or more other applicable processes, or a combination thereof.

Afterwards, a dielectric material layer is deposited over the etch stop material layer, in accordance with some embodiments. The dielectric material layer may be made of or include carbon-containing silicon oxide, silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable materials, or a combination thereof. The dielectric material layer may be deposited using a CVD process, an ALD process, a PECVD process, one or more other applicable processes, or a combination thereof.

As shown in FIGS. 2E-1 and 2E-2, a planarization process is performed over the dielectric material layer to remove upper portions of the dielectric material layer, the etch stop material layer, the spacer layers 180 and 190 and the mask layer 140, in accordance with some embodiments. After the planarization process, the etch stop material layer forms an etch stop layer 210, and the dielectric material layer forms a dielectric layer 220, in accordance with some embodiments.

In some embodiments, top surfaces 134b, 185, 192, 212, and 222 of the gate electrode 134, the spacer layers 180 and 190, the etch stop layer 210, and the dielectric layer 220 are substantially coplanar, in accordance with some embodiments. The term "substantially coplanar" in the application may include small deviations from coplanar geometries. The deviations may be due to manufacturing processes.

In some embodiments, an upper portion 214 of the etch stop layer 210 is spaced apart from an upper portion 188 of the spacer layer 180. The spacer layer 190 and the etch stop layer 210 are made of different materials, in accordance with some embodiments. In some embodiments, an etching selectivity between the spacer layer 190 and the etch stop layer 210 is large enough to remove one of them independently.

As shown in FIGS. 2F-1 and 2F-2, the gate stack 130 is removed to form a trench 184 in the spacer layer 180, in accordance with some embodiments. As shown in FIGS. 2F-1 and 2F-2, a gate stack 230 is formed in the trench 184, in accordance with some embodiments. The gate stack 230 includes a gate dielectric layer 232, a work function layer 234, and a gate electrode 236, in accordance with some embodiments.

The gate dielectric layer 232 conformally covers a bottom surface 184a and inner walls 184b of the trench 184, in accordance with some embodiments. The work function layer 234 conformally covers the gate dielectric layer 232, in accordance with some embodiments. The gate electrode 236 is over the work function layer 234, in accordance with some embodiments. The gate stack 230 is in a lower portion of the trench 184, in accordance with some embodiments.

The gate dielectric layer 232 is made of a dielectric material, such as a high dielectric constant (high-k) material, in accordance with some embodiments. The high-k material is made of metal oxides, such as hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), aluminum oxide, hafnium dioxide-alumina ($HfO_2$—$Al_2O_3$) alloy, or combinations thereof, in accordance with some embodiments.

In some other embodiments, the high-k material is made of metal nitrides, metal silicates, transition metal-oxides, transition metal-nitrides, transition metal-silicates, oxynitrides of metals, other suitable materials, or combinations thereof. The gate dielectric layer 232 is formed using a chemical vapor deposition (CVD) process, a thermal atomic layer deposition (ALD) process, a plasma enhanced atomic layer deposition (PEALD) process, or another suitable deposition process.

The work function metal layer 234 provides a desired work function for transistors to enhance device performance including improved threshold voltage. In the embodiments of forming an NMOS transistor, the work function metal layer 234 can be a material capable of providing a work function value suitable for the device, such as equal to or less than about 4.5 eV. The work function metal layer 234 may be made of metal, metal carbide, metal nitride, or a combination thereof. For example, the work function metal layer 234 is made of tantalum, tantalum nitride, or a combination thereof.

In the embodiments of forming a PMOS transistor, the work function metal layer 234 can be a material capable of providing a work function value suitable for the device, such as equal to or greater than about 4.8 eV. The work function metal layer 234 may be made of metal, metal carbide, metal nitride, other suitable materials, or a combination thereof. For example, the work function metal layer 234 is made of titanium, titanium nitride, other suitable materials, or a combination thereof.

The work function metal layer 234 is formed using a deposition process, in accordance with some embodiments. The deposition process includes a physical vapor deposition (PVD) process, a chemical vapor deposition (CVD) process, an atomic layer deposition (ALD) process, another suitable method, or a combination thereof.

The gate electrode 236 are made of a suitable metal material, such as aluminum, tungsten, gold, platinum, cobalt, another suitable metal, an alloy thereof, or a combination thereof, in accordance with some embodiments. The gate electrode 236 is formed using a deposition process, in accordance with some embodiments. The deposition process includes a physical vapor deposition (PVD) process, a chemical vapor deposition (CVD) process, an atomic layer deposition (ALD) process, another suitable method, or a combination thereof.

As shown in FIGS. 2F-1 and 2F-2, a cap layer 240 is formed in the trench 184 and over the gate stack 230, in accordance with some embodiments. The cap layer 240 has a thickness T240 ranging from about 1 nm to about 30 nm, in accordance with some embodiments. The cap layer 240 and the gate stack 230 are made of different materials, in accordance with some embodiments. The cap layer 240 is made of Si, SiO, SiN, SiC, SiCN, SiOC, SiON, SiCN, SiOCN, ZrO, ZrN, $HfO_2$, $Al_2O_3$, AlON, or a high-k material, in accordance with some embodiments.

The high-k material is made of metal oxides, such as hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), aluminum oxide, hafnium dioxide-alumina ($HfO_2$—$Al_2O_3$) alloy, or combinations thereof, in accordance with some embodiments. In some other embodiments, the high-k material is made of metal nitrides, metal silicates, transition metal-oxides, transition metal-nitrides, transition metal-silicates, oxynitrides of metals, other suitable materials, or combinations thereof.

As shown in FIGS. 2F-1 and 2F-2, portions of the dielectric layer 220, the etch stop layer 210, the spacer layer 180, and the cap layer 170 are removed to form through holes 224 in the dielectric layer 220, the etch stop layer 210, the spacer layer 180, and the cap layer 170, in accordance with some embodiments. The through holes 224 expose the stressors 160 thereunder, in accordance with some embodiments.

Thereafter, as shown in FIGS. 2F-1 and 2F-2, a metal silicide layer 250 is formed over and in the stressors 160, in accordance with some embodiments. The metal silicide layer 250 has a thickness T250 ranging from about 1 nm to about 10 nm, in accordance with some embodiments. The metal silicide layer 250 is made of a silicide of a metal such as Ti, Co, Ni, NiCo, Pt, Ni(Pt), Ir, Pt(Ir), Er, Yb, Pd, Rh, or Nb, TiSiN, in accordance with some embodiments. The metal silicide layer 250 is formed using a silicidation process, in accordance with some embodiments.

Afterwards, as shown in FIGS. 2F-1 and 2F-2, contact structures 260 are formed in the through holes 224, in accordance with some embodiments. The contact structures 260 are electrically connected to the stressors 160 thereunder through the metal silicide layer 250, in accordance with some embodiments. The contact structures 260 pass through the dielectric layer 220, the etch stop layer 210, the spacer layer 180, and the cap layer 170, in accordance with some embodiments.

The contact structure 260 has a thickness T260 ranging from about 1 nm to about 90 nm, in accordance with some embodiments. The contact structures 260 are made of a metal material such as W, Co, Ru, Ti, Ni, Cu, Au, Ag, Pt, Pd, Ir, Os, Rh, Al, or Mo, in accordance with some embodiments.

In some embodiments (not shown), before the formation of the contact structures 260, a barrier layer is formed over inner walls of the through holes 224 and the metal silicide layer 250, and the contact structures 260 are formed over the barrier layer. The barrier layer is made of a metal material such as Ti, Ta, TiN, TaN, W, Co, or Ru, in accordance with some embodiments. The barrier layer has a thickness ranging from about 0.5 nm to about 10 nm, in accordance with some embodiments.

As shown in FIGS. 2G-1 and 2G-2, upper portions of the contact structures 260 are removed to form recesses R2 in the through holes 224, in accordance with some embodiments. As shown in FIGS. 2G-1 and 2G-2, a cap layer 270 is formed in the recesses R2 and over the contact structures 260, in accordance with some embodiments.

The cap layer 270 has a thickness T270 ranging from about 0.5 nm to about 30 nm, in accordance with some embodiments. The cap layer 270 and the contact structures 260 are made of different materials, in accordance with some embodiments. The cap layer 270 is made of an insulating material, a metal material, or a semiconductor material, in accordance with some embodiments.

The insulating material includes $SiO_2$, SiN, SiC, SiCN, SiOC, SiON, SiCN, SiOCN, ZrO, ZrN, $HfO_2$, $Al_2O_3$, AlON, or a high-k material, in accordance with some embodiments. The high-k material is made of metal oxides, such as hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), aluminum oxide, hafnium dioxide-alumina ($HfO_2$—$Al_2O_3$) alloy, or combinations thereof, in accordance with some embodiments. In some other embodiments, the high-k material is made of metal nitrides, metal silicates, transition metal-oxides, transition metal-nitrides, transition metal-silicates, oxynitrides of metals, other suitable materials, or combinations thereof. The metal material includes W, Co, Ru, Ti, Ni, Cu, Au, Ag, Pt, Pd, Ir, Os, Rh, Al, or Mo, in accordance with some embodiments. The semiconductor material includes Si, in accordance with some embodiments.

The spacer layer 180 has a thickness T180 ranging from about 0.5 nm to about 10 nm, in accordance with some embodiments. The spacer layer 190 has a thickness T190 ranging from about 0.5 nm to about 10 nm, in accordance with some embodiments. In some embodiments, the thickness T190 is greater than the thickness T180. In some embodiments, the thickness T190 is greater than a thickness T210 of the etch stop layer 210. In some embodiments, a sum of the thicknesses T180, T190 and T210 is greater than a thickness T150 of the spacer structure 150.

As shown in FIGS. 2H-1 and 2H-2, upper portions of the spacer layer 190 are removed to form trenches TR1, in accordance with some embodiments. Each trench TR1 is between the spacer layer 180 and the etch stop layer 210, in accordance with some embodiments. Each trench TR1 is surrounded by the spacer layer 180, the etch stop layer 210, and the spacer layer 190, in accordance with some embodiments.

As shown in FIGS. 2I-1 and 2I-2, the spacer layer 180 and the etch stop layer 210 are partially and laterally removed through the trenches TR1 to widen the trenches TR1, in accordance with some embodiments. As shown in FIGS. 2J-1 and 2J-2, the remaining spacer layer 190 is removed to form trenches TR2 under and connected to the corresponding trenches TR1, in accordance with some embodiments.

The width W1 of the trench TR1 (continuously) decreases toward the substrate 110, in accordance with some embodiments. The width W2 of the trench TR2 (continuously) decreases toward the substrate 110, in accordance with some embodiments. In some embodiments, a ratio of the width W1 to the width W2 ranges from about 1.1 to about 10. The etch stop layer 210 has sidewalls 215 and 217 and a level surface 216, in accordance with some embodiments.

The sidewalls 215 and 217 are not coplanar, in accordance with some embodiments. The sidewalls 215 and 217 are discontinuous, in accordance with some embodiments. The level surface 216 is between and connected to the sidewalls 215 and 217, in accordance with some embodiments. The sidewalls 215 and 217 and the level surface 216 together form a stair-shaped sidewall 218, in accordance with some embodiments.

The spacer layer 180 has sidewalls 187 and 189 and a level surface 188, in accordance with some embodiments. The sidewalls 187 and 189 are not coplanar, in accordance with some embodiments. The sidewalls 187 and 189 are discontinuous, in accordance with some embodiments. The level surface 188 is between and connected to the sidewalls 187 and 189, in accordance with some embodiments. The sidewalls 187 and 189 and the level surface 188 together form a stair-shaped sidewall 181, in accordance with some embodiments. The stair-shaped sidewall 181 faces the stair-shaped sidewall 218, in accordance with some embodiments.

FIG. 2K-3 is a top view of the semiconductor device structure of FIG. 2K-1, in accordance with some embodiments. FIG. 2K-4 is a cross-sectional view illustrating the semiconductor device structure along a sectional line III-III' in FIG. 2K-3, in accordance with some embodiments.

As shown in FIGS. 2K-1, 2K-2, 2K-3, and 2K-4, seal structures 280 are formed in the trenches TR1, in accordance with some embodiments. Each seal structure 280 is between the upper portion 214 of the etch stop layer 210 and the upper portion 188 of the spacer layer 180, in accordance with some embodiments. The seal structure 280 is in direct contact with the stair-shaped sidewall 218 of the etch stop layer 210 and the stair-shaped sidewall 181 of the spacer layer 180, in accordance with some embodiments.

The seal structure 280 has a width W280 ranging from about 0.5 nm to about 10 nm, in accordance with some embodiments. The seal structure 280 has a height H2 ranging from about 0.5 nm to about 30 nm, in accordance with some embodiments. The seal structure 280 is a single layered structure, in accordance with some embodiments.

The seal structure 280 is a multi-layered structure, in accordance with some embodiments.

The seal structure 280 has a void 282, in accordance with some embodiments. The void 282 is a close void, in accordance with some embodiments. The void 282 has a width W282 ranging from about 0.5 nm to about 5 nm, in accordance with some embodiments. The seal structure 280 is made of Si, SiO, SiN, SiC, SiCN, SiOC, SiON, SiCN, SiOCN, ZrO, ZrN, HfO$_2$, Al$_2$O$_3$, AlON, or a high-k material, in accordance with some embodiments.

The high-k material is made of metal oxides, such as hafnium oxide (HfO$_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), aluminum oxide, hafnium dioxide-alumina (HfO$_2$—Al$_2$O$_3$) alloy, or combinations thereof, in accordance with some embodiments. In some other embodiments, the high-k material is made of metal nitrides, metal silicates, transition metal-oxides, transition metal-nitrides, transition metal-silicates, oxynitrides of metals, other suitable materials, or combinations thereof.

In some embodiments, after the formation of the seal structures 280, the trenches TR2 become air gaps A. The air gaps A are close gaps, in accordance with some embodiments. Each air gap A is surrounded by the seal structure 280, the spacer layer 180, and the etch stop layer 210, in accordance with some embodiments. A portion of the air gaps A is over the spacer structure 150, in accordance with some embodiments. A portion of the air gaps A is over the fin 114, in accordance with some embodiments.

The air gap A is between the gate stack 230 and the contact structure 260, in accordance with some embodiments. The air gap A has a width W3 ranging from about 0.5 nm to about 10 nm, in accordance with some embodiments. The air gap A has a height H1 ranging from about 1 nm to about 100 nm, in accordance with some embodiments. In this step, a semiconductor device structure 200 is substantially formed, in accordance with some embodiments.

The materials of the spacer layer 180 and the spacer structure 150 may be different from each other for different purposes. The (L-shaped) spacer layer 180 is able to protect the spacer structure 150 and the stressors 160 thereunder from damage during removing the spacer layer 190 of FIGS. 2I-1 and 2J-1, in accordance with some embodiments.

The formation of the air gaps A between the gate stack 230 and the contact structures 260 decreases the capacitance between the gate stack 230 and the contact structures 260, in accordance with some embodiments. Therefore, the performance of the semiconductor device structure 200 is improved, in accordance with some embodiments.

Figures 2, 3A:
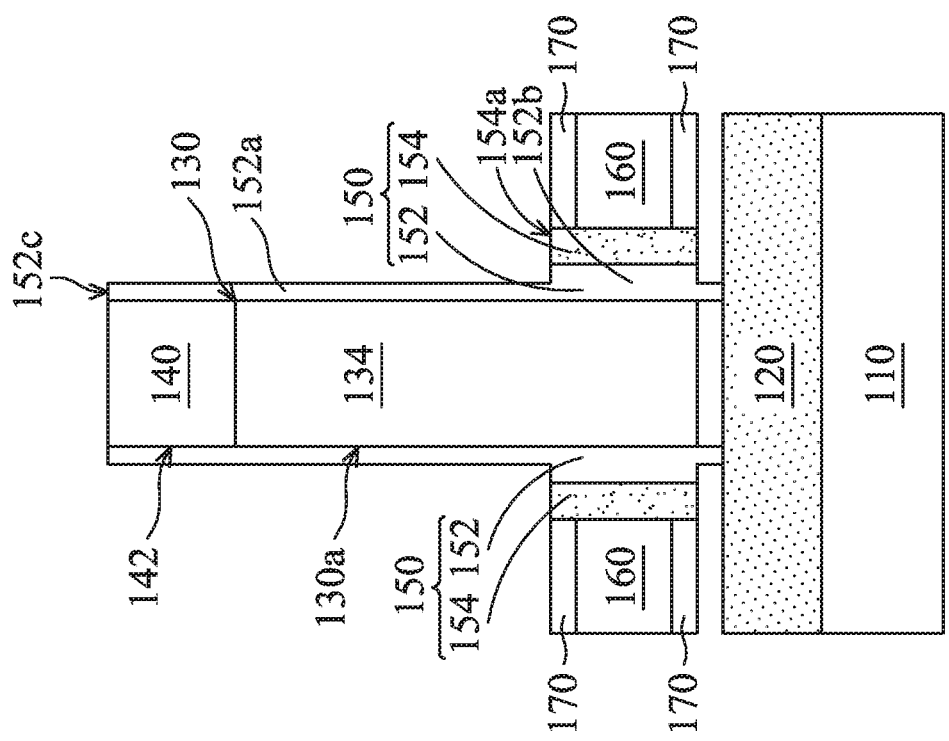
Figures 1, 3A:
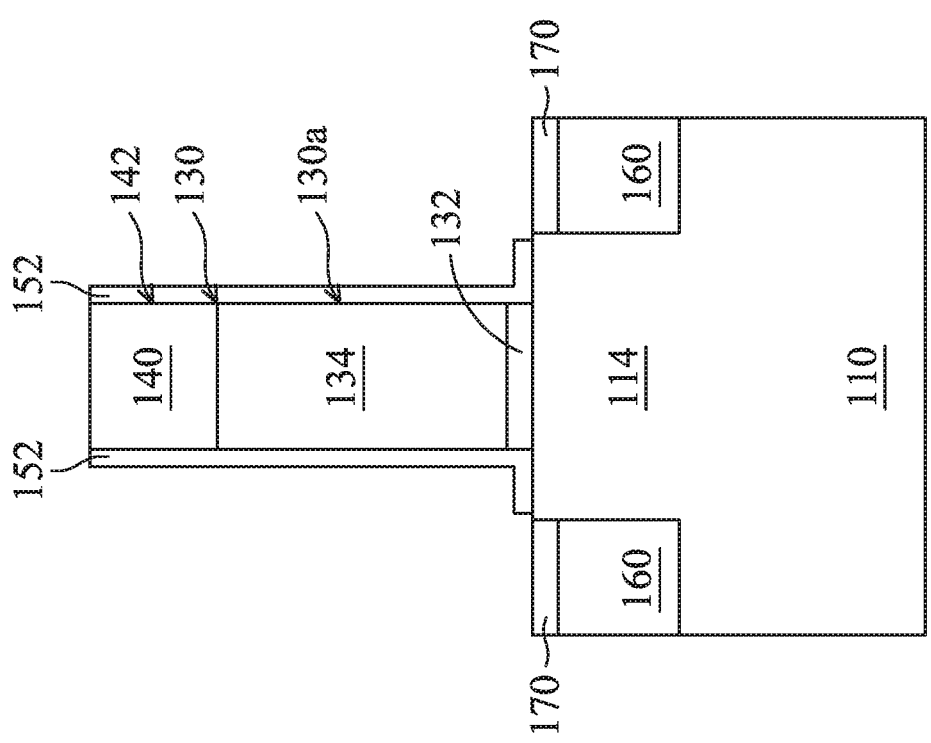
Figures 1, 2, 3B:
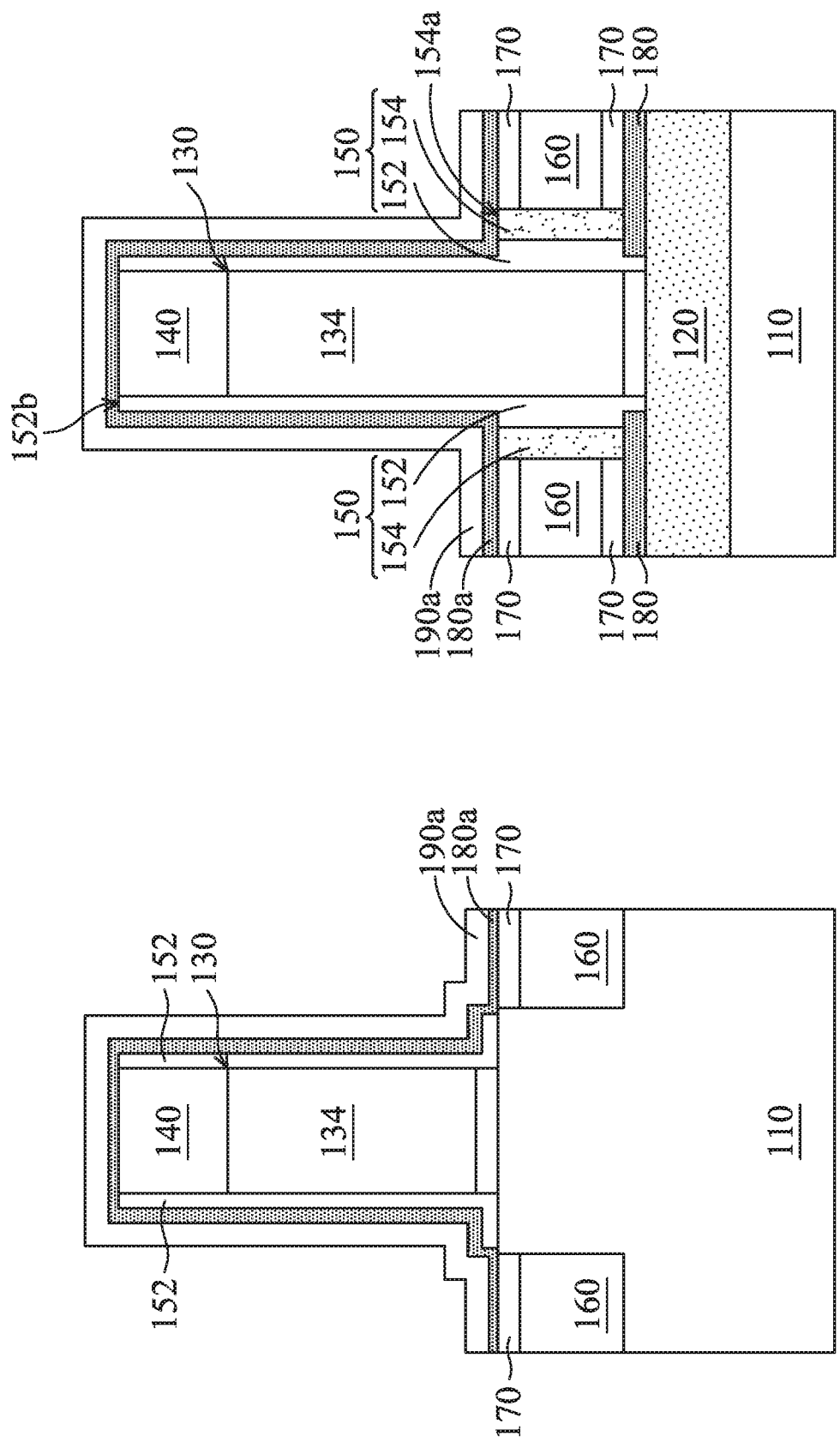
Figures 2, 3C:
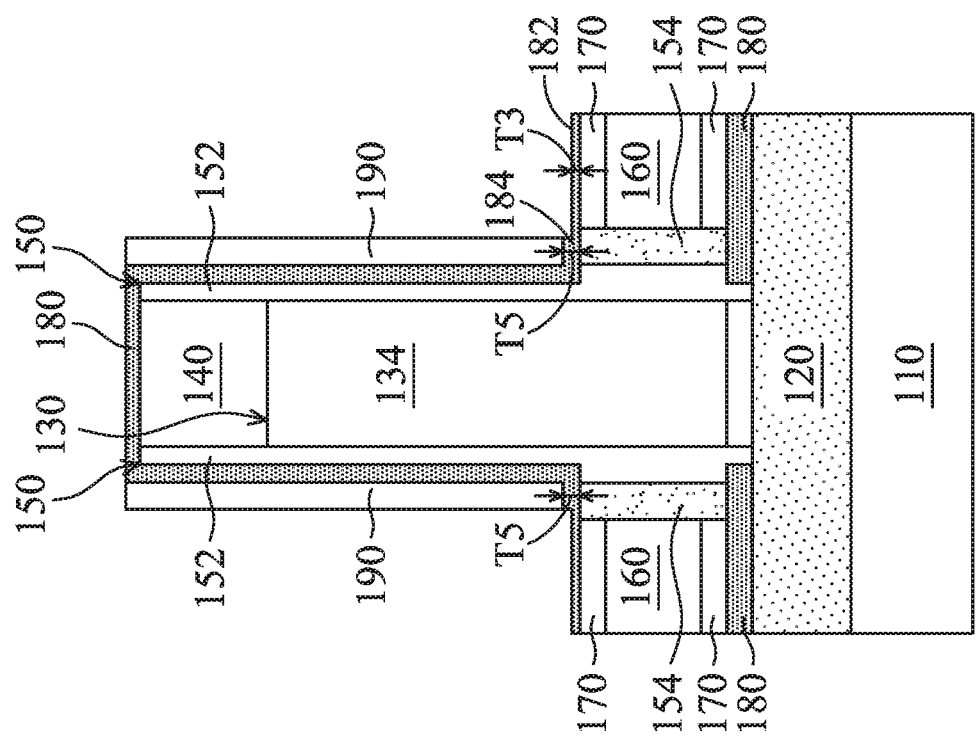
Figures 1, 3C:
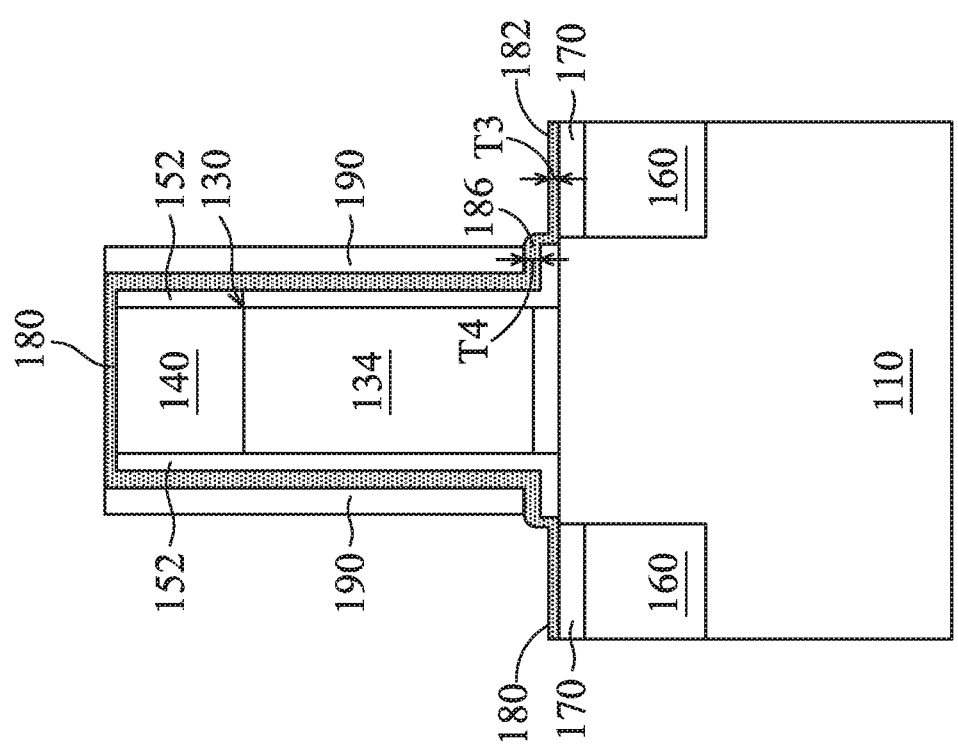
Figures 1, 3D:
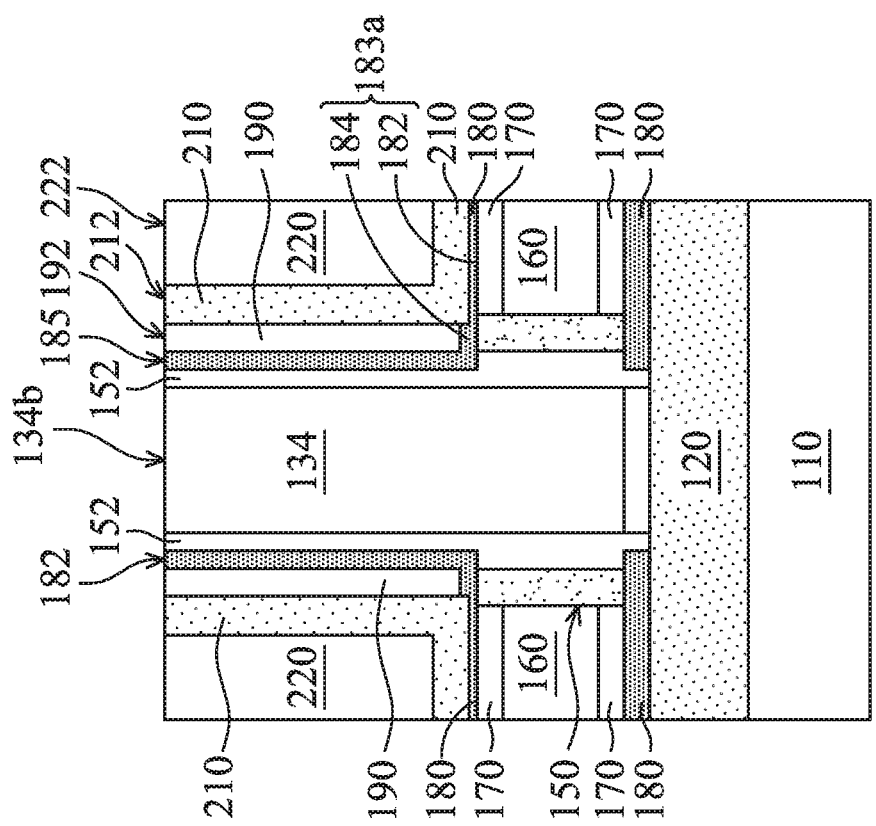
Figures 2, 3D:
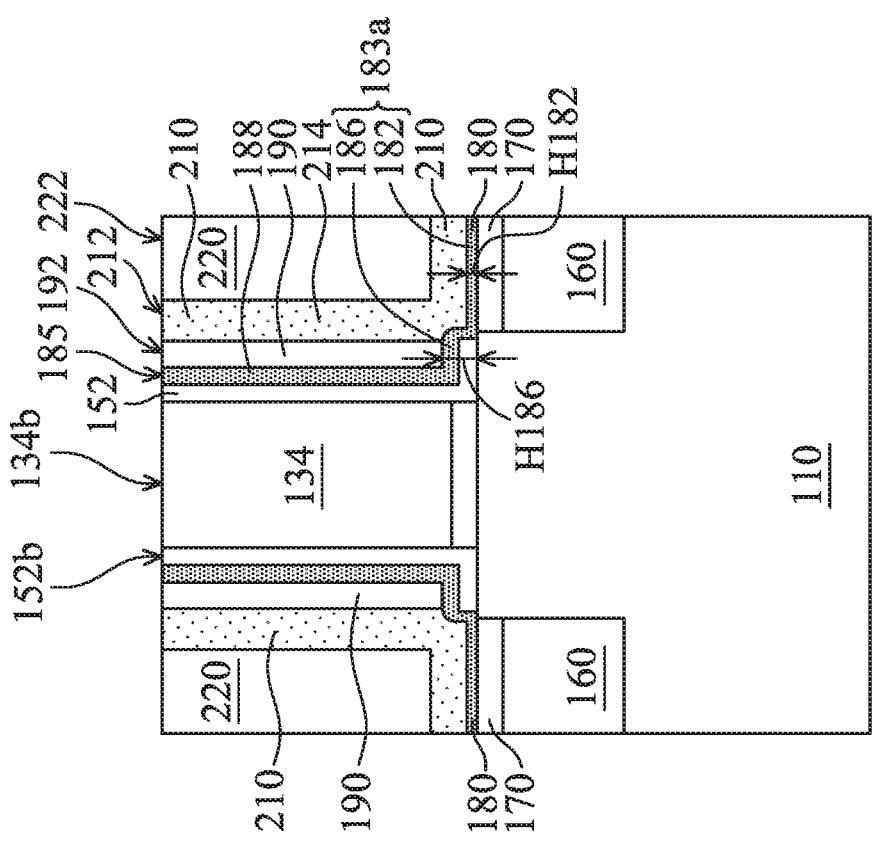
Figures 2, 3E:
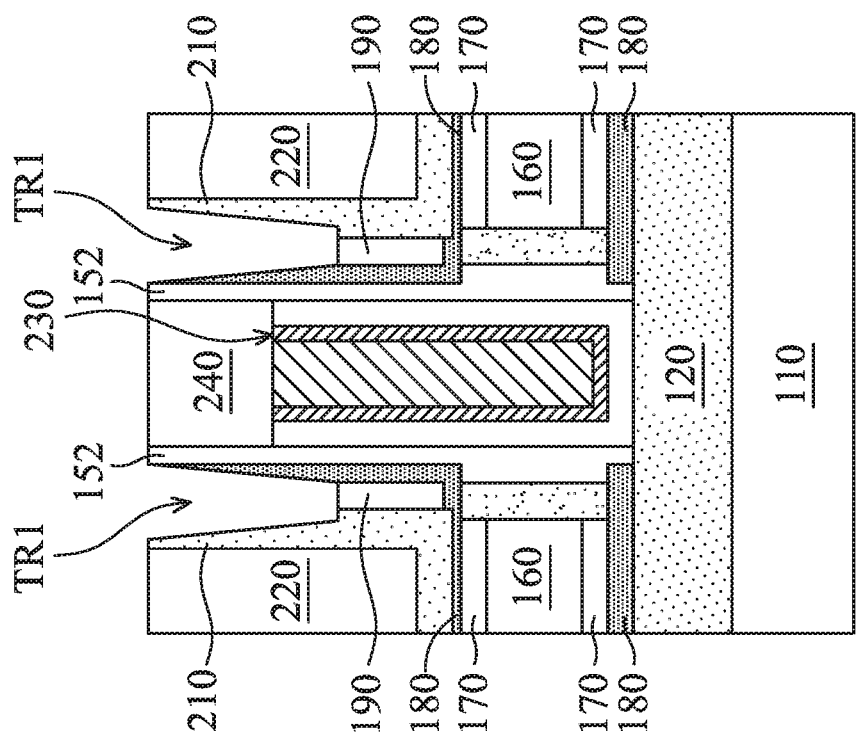
Figures 1, 3E:
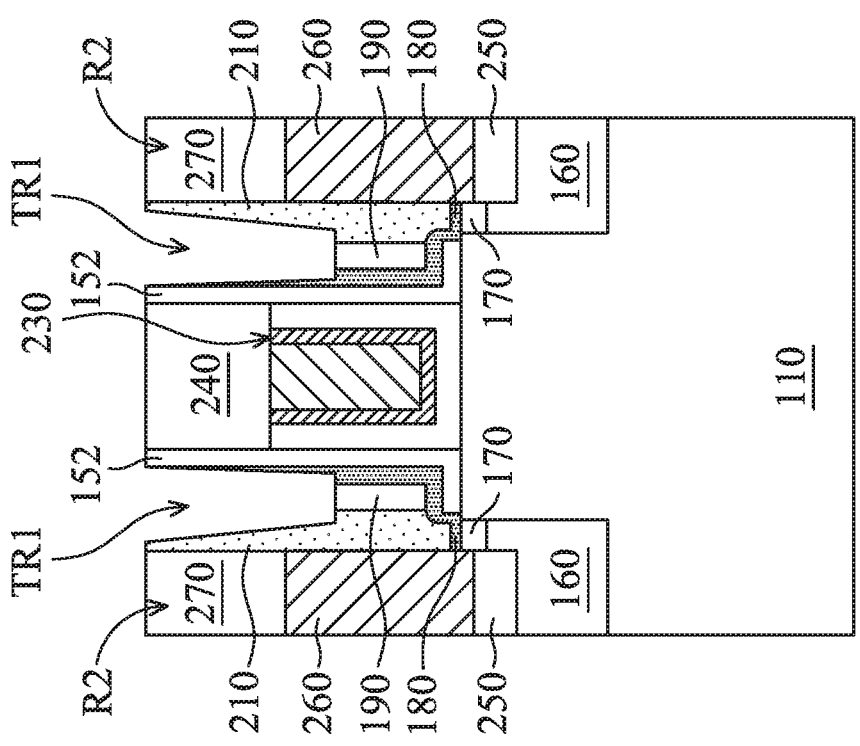
Figures 2, 3F:
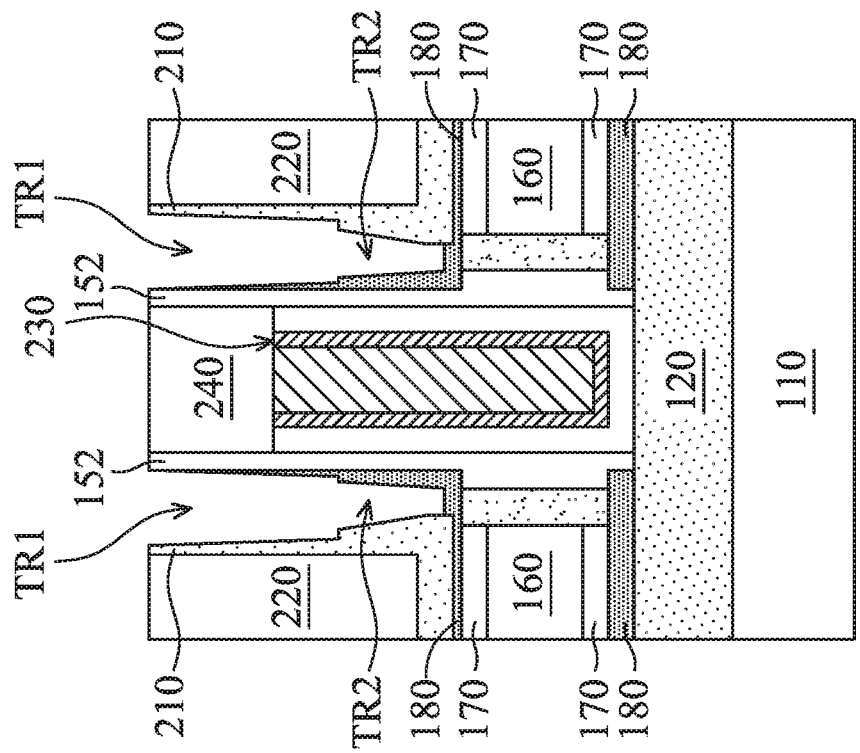
Figures 1, 3F:
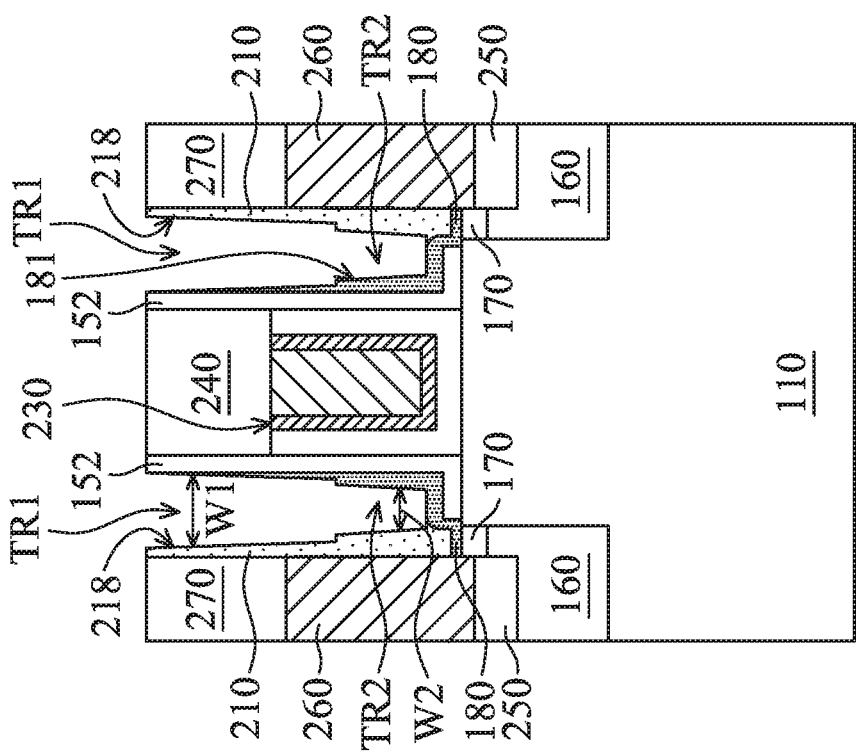
Figures 3, 3G:
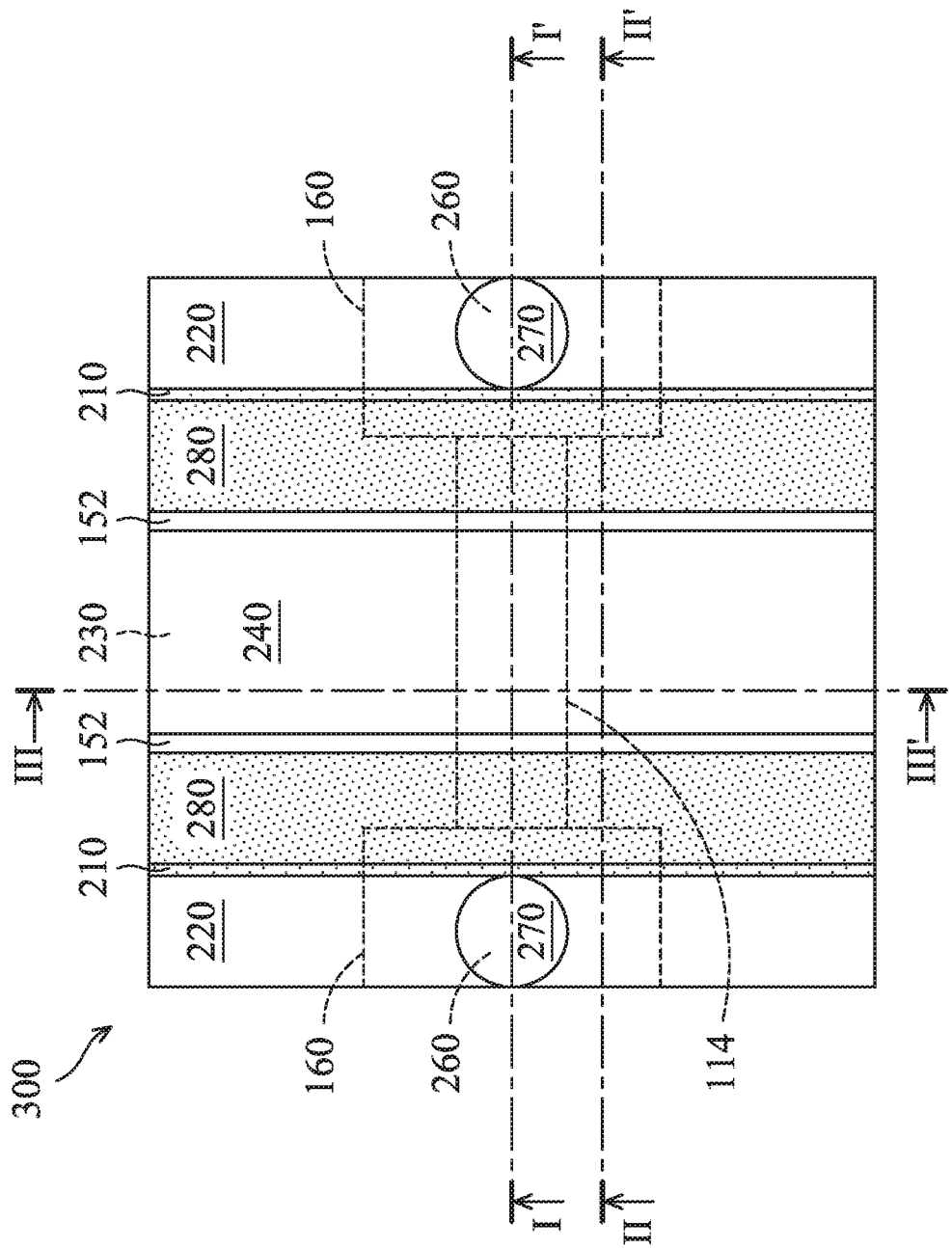
Figures 3, 3G, 4:
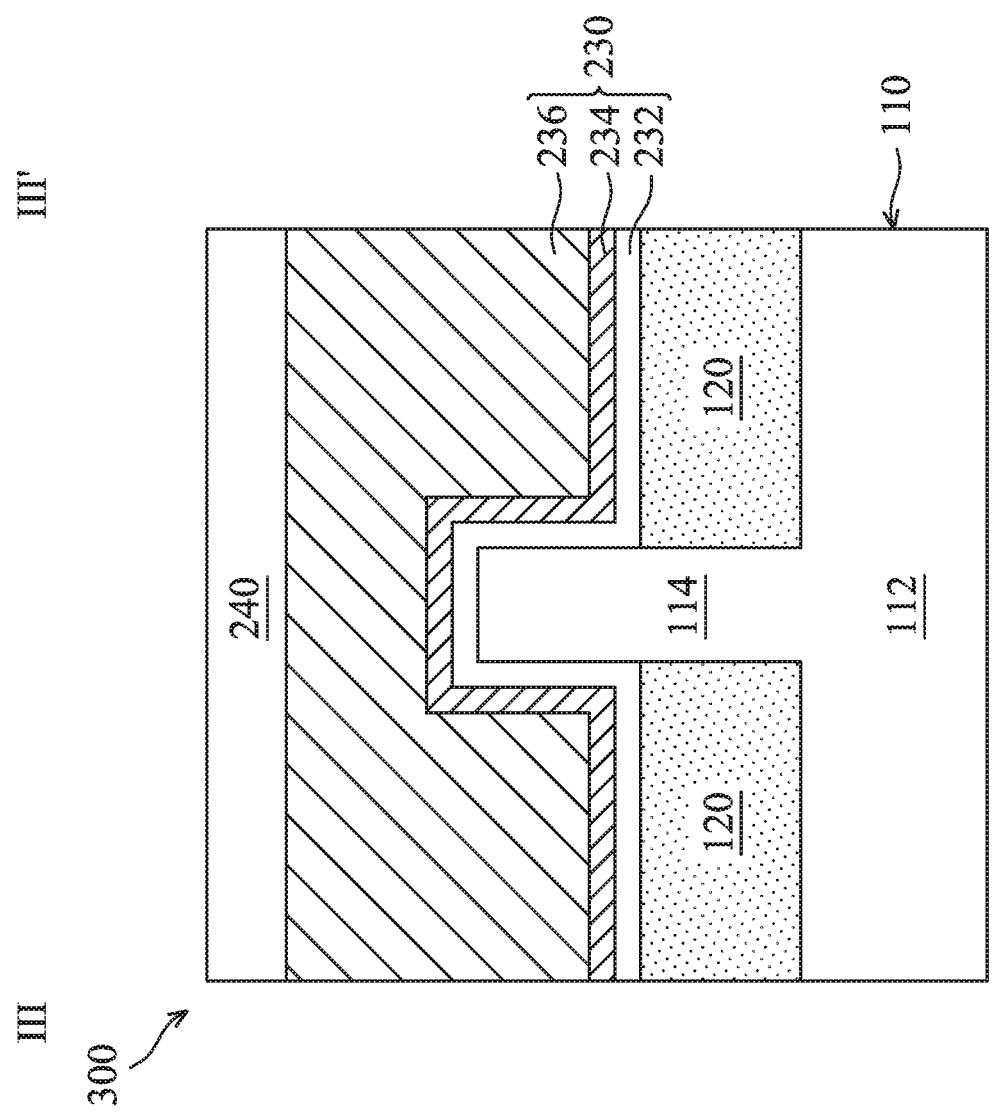

FIGS. 3A-1 to 3G-1 are cross-sectional views of various stages of a process for forming a semiconductor device structure, in accordance with some embodiments. FIGS. 3A-2 to 3G-2 are cross-sectional views of various stages of a process for forming the semiconductor device structure, in accordance with some embodiments.

After the step of FIGS. 2A-1 and 2A-2, as shown in FIGS. 3A-1 and 3A-2, the spacer structure 150 is partially removed, in accordance with some embodiments. After the removal process, the spacer layer 154 remains between the gate stack 130 and the stressors 160 and between the gate stack 130 and the cap layer 170, in accordance with some embodiments.

The spacer layer 152 has an upper portion 152a and a lower portion 152b, in accordance with some embodiments. The lower portion 152b is between the gate stack 130 and the stressors 160 and between the gate stack 130 and the cap layer 170, in accordance with some embodiments. The lower portion 152b is thicker than the upper portion 152a, in accordance with some embodiments. In some embodiments, a top surface 152c of the spacer layer 152 is higher than a top surface 154a of the spacer layer 154.

As shown in FIGS. 3B-1 and 3B-2, a spacer material layer 180a is conformally formed over the cap layer 170, the mask layer 140, and the spacer layers 152 and 154, in accordance with some embodiments. As shown in FIGS. 3B-1 and 3B-2, a spacer material layer 190a is conformally formed over the spacer material layer 180a, in accordance with some embodiments.

As shown in FIGS. 3C-1 and 3C-2, the spacer material layer 190a over the mask layer 140 and the stressors 160 is removed, in accordance with some embodiments. That is, the spacer material layer 190a over level surfaces of the spacer material layer 180a is removed, in accordance with some embodiments. After the removal process, the patterned spacer material layer 190a forms a spacer layer 190, in accordance with some embodiments.

The removal process further partially removes the spacer material layer 180a exposed by the spacer layer 190, in accordance with some embodiments. That is, the removal process partially removes upper portions of the spacer material layer 180a over the stressors 160 and the mask layer 140, in accordance with some embodiments. After the removal process, the patterned spacer material layer 180a forms a spacer layer 180, in accordance with some embodiments.

The spacer layer 180 covers the spacer structure 150, the cap layer 170, and the mask layer 140, in accordance with some embodiments. Thereafter, an etch stop material layer (not shown) is deposited over the spacer layers 180 and 190, in accordance with some embodiments. Afterwards, a dielectric material layer is deposited over the etch stop material layer, in accordance with some embodiments.

As shown in FIGS. 3D-1 and 3D-2, a planarization process is performed over the dielectric material layer to remove upper portions of the dielectric material layer, the etch stop material layer, the spacer layers 180 and 190 and the mask layer 140, in accordance with some embodiments. After the planarization process, the etch stop material layer forms an etch stop layer 210, and the dielectric material layer forms a dielectric layer 220, in accordance with some embodiments.

In some embodiments, top surfaces 134b, 152b, 185, 192, 212, and 222 of the gate electrode 134, the spacer layer 152, the spacer layers 180 and 190, the etch stop layer 210, and the dielectric layer 220 are substantially coplanar, in accordance with some embodiments. The term "substantially coplanar" in the application may include small deviations from coplanar geometries. The deviations may be due to manufacturing processes.

In some embodiments, an upper portion 214 of the etch stop layer 210 is spaced apart from an upper portion 188 of the spacer layer 180. The spacer layer 190 and the etch stop layer 210 are made of different materials, in accordance with some embodiments. In some embodiments, an etching selectivity between the spacer layer 190 and the etch stop layer 210 is large enough to remove one of them independently.

The spacer layer 180 has a stair shaped structure 183a having steps 182, 184 and 186, in accordance with some embodiments. The step 184 is thicker than the step 182, in accordance with some embodiments. The step 186 is thicker than the step 182, in accordance with some embodiments. The step 186 has a height H186 ranging from about 0.5 nm to about 10 nm, in accordance with some embodiments. The step 182 has a height H182 ranging from about 0.5 nm to about 5 nm, in accordance with some embodiments.

As shown in FIGS. 3E-1 and 3E-2, the steps of FIGS. 2F-1 to 2I-1 are performed, in accordance with some embodiments. The gate stack 130 is removed and the gate stack 230, the cap layer 240, the metal silicide layer 250, the contact structures 260, and the cap layer 270 are formed, in accordance with some embodiments. As shown in FIGS. 3E-1 and 3E-2, upper portions of the spacer layers 180 and 190 and the etch stop layer 210 are removed, in accordance with some embodiments.

As shown in FIGS. 3F-1 and 3F-2, the remaining spacer layer 190 is removed to form trenches TR2 under and connected to the trenches TR1 thereover, in accordance with some embodiments. The width W1 of the trench TR1 (continuously) decreases toward the substrate 110, in accordance with some embodiments. The width W2 of the trench TR2 (continuously) decreases toward the substrate 110, in accordance with some embodiments.

The etch stop layer 210 has a stair-shaped sidewall 218, in accordance with some embodiments. The spacer layer 180 has a stair-shaped sidewall 181, in accordance with some embodiments. The stair-shaped sidewall 181 faces the stair-shaped sidewall 218, in accordance with some embodiments.

Figures 2, 2K, 3, 4:
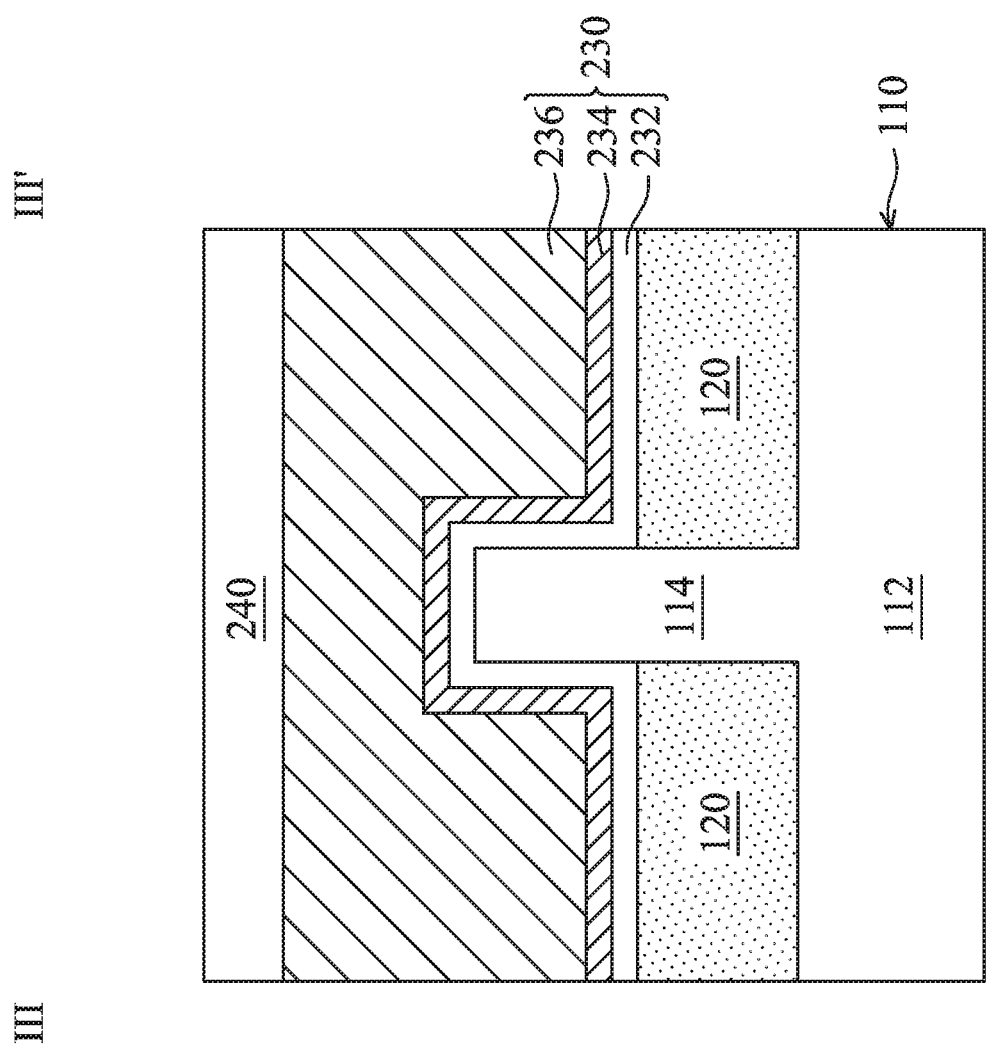

FIG. 3G-3 is a top view of the semiconductor device structure of FIG. 3G-1, in accordance with some embodiments. FIG. 3G-4 is a cross-sectional view illustrating the semiconductor device structure along a sectional line III-III' in FIG. 3G-3, in accordance with some embodiments.

As shown in FIGS. 3G-1, 3G-2, 3G-3 and 3G-4, seal structures 280 are formed in the trenches TR1, in accordance with some embodiments. The seal structure 280 is in direct contact with the stair-shaped sidewall 218 of the etch stop layer 210 and the stair-shaped sidewall 181 of the spacer layer 180, in accordance with some embodiments.

The seal structure 280 is a single layered structure, in accordance with some embodiments. The seal structure 280 is a multi-layered structure, in accordance with some embodiments. The seal structure 280 has a void 282, in accordance with some embodiments. The void 282 is a close void, in accordance with some embodiments.

In some embodiments, after the formation of the seal structures 280, the trenches TR2 become air gaps A. The air gaps A are close gaps, in accordance with some embodiments. Each air gap A is surrounded by the seal structure 280, the spacer layer 180, and the etch stop layer 210, in accordance with some embodiments. A portion of the air gaps A is over the spacer structure 150, in accordance with some embodiments.

A portion of the air gaps A is over the fin 114, in accordance with some embodiments. The air gap A is between the gate stack 230 and the contact structure 260, in accordance with some embodiments. In this step, a semiconductor device structure 300 is substantially formed, in accordance with some embodiments.

Figure 4A:
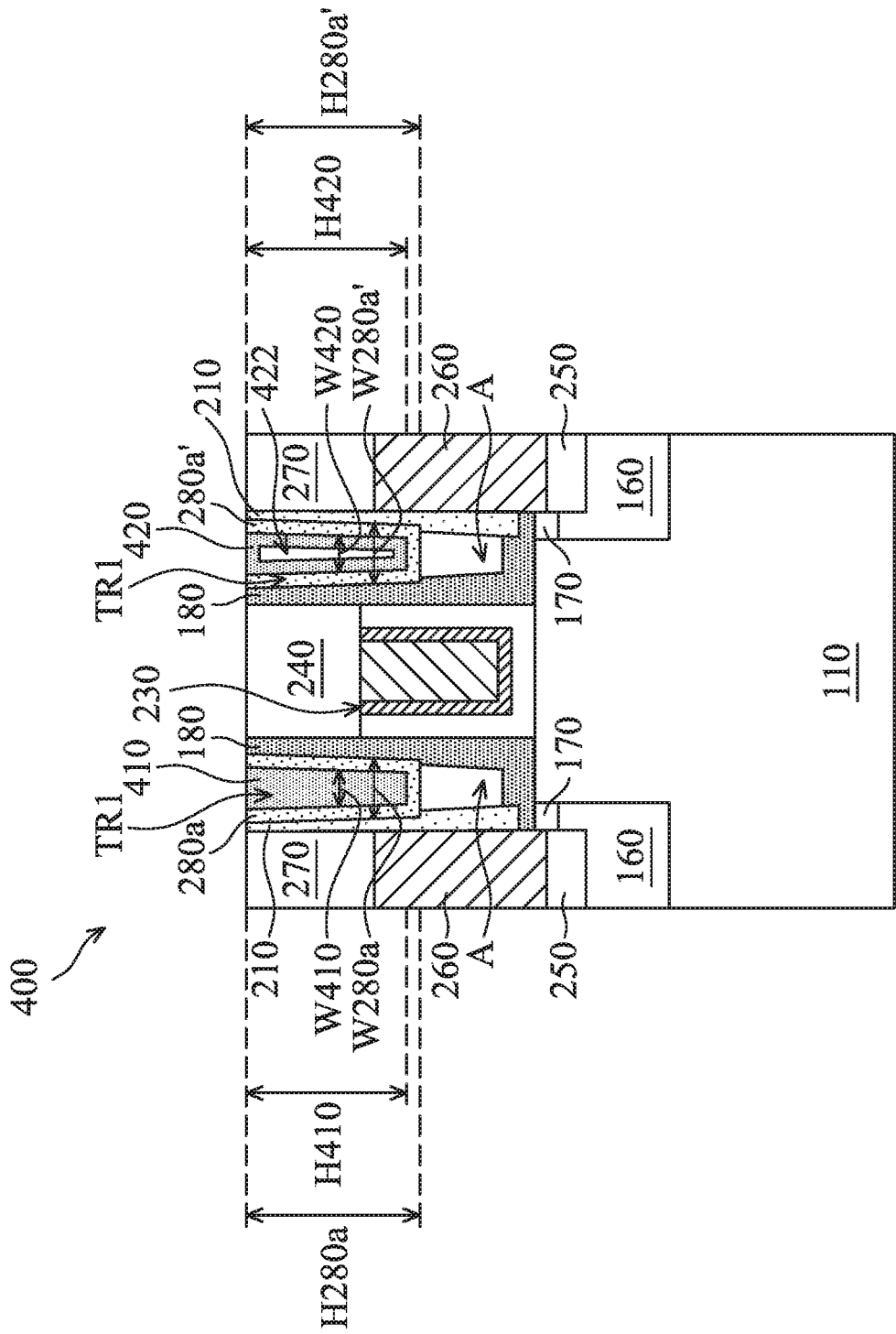
FIG. 4A is a cross-sectional view illustrating a first variation of the semiconductor device structure of FIG. 2K-1, in accordance with some embodiments.
Figure 4B:
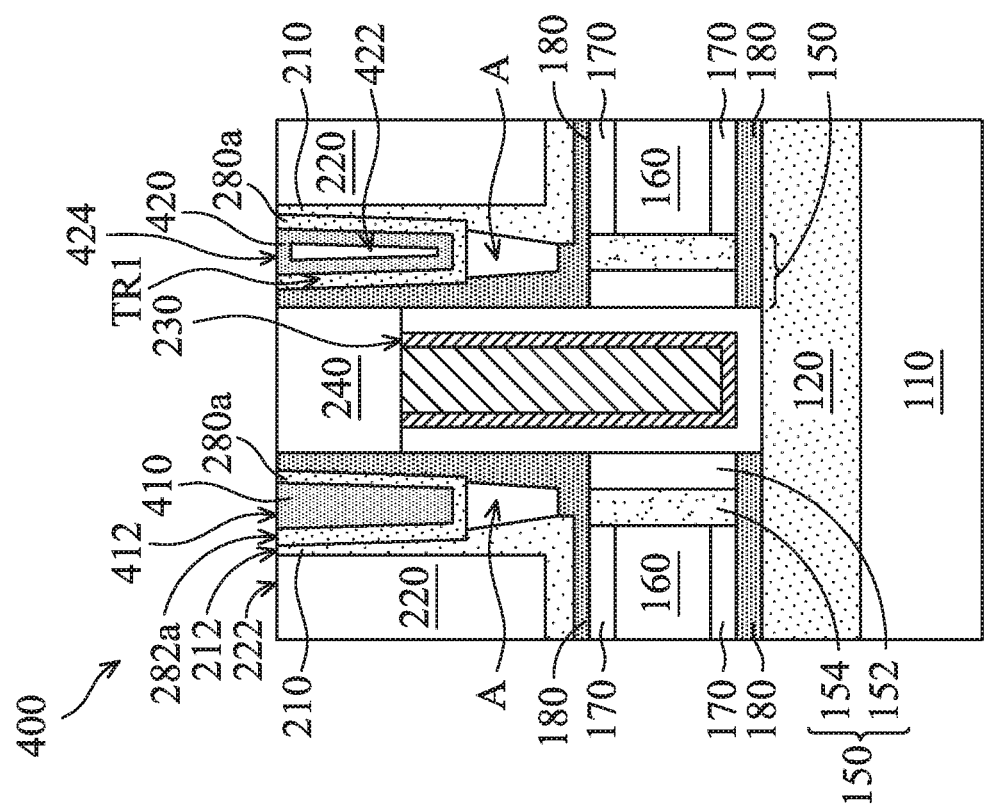
FIG. 4B is a cross-sectional view illustrating the first variation of the semiconductor device structure of FIG. 2K-2, in accordance with some embodiments.

FIG. 4A is a cross-sectional view illustrating a first variation of the semiconductor device structure 200 of FIG. 2K-1, in accordance with some embodiments. FIG. 4B is a cross-sectional view illustrating the first variation of the semiconductor device structure 200 of FIG. 2K-2, in accordance with some embodiments.

As shown in FIGS. 4A and 4B, a semiconductor device structure 400 is similar to the semiconductor device structure 200 of FIGS. 2K-1 and 2K-2, except that the semiconductor device structure 400 further includes seal structures 410 and 420, in accordance with some embodiments. The seal structure 410 is embedded in a seal structure 280a in the trench TR1, in accordance with some embodiments. The seal structure 420 is embedded in a seal structure 280a' in the trench TR1, in accordance with some embodiments. The seal structure 420 has a void 422, in accordance with some embodiments.

The seal structure 410 and the seal structure 280a are made of different materials, in accordance with some embodiments. The seal structure 420 and the seal structure 280a' are made of different materials, in accordance with some embodiments. The dielectric constant of the seal structure 410 or 420 is lower than the dielectric constant of the seal structure 280a or 280a', in accordance with some embodiments. The top surfaces 222, 212, 282a, 412 and 424 of the dielectric layer 220, the etch stop layer 210, the seal structures 280a, and the seal structures 410 and 420 are substantially coplanar, in accordance with some embodiments.

The seal structure 410 or 420 or the seal structure 280a or 280a' is made of Si, SiO, SiN, SiC, SiCN, SiOC, SiON, SiCN, SiOCN, ZrO, ZrN, HfO$_2$, Al$_2$O$_3$, AlON, or a high-k material, in accordance with some embodiments.

The high-k material is made of metal oxides, such as hafnium oxide (HfO$_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), aluminum oxide, hafnium dioxide-alumina (HfO$_2$—Al$_2$O$_3$) alloy, or combinations thereof, in accordance with some embodiments. In some other embodiments, the high-k material is made of metal nitrides, metal silicates, transition metal-oxides, transition metal-nitrides, transition metal-silicates, oxynitrides of metals, other suitable materials, or combinations thereof.

The seal structure 280a has a width W280a ranging from about 0.5 nm to about 10 nm, in accordance with some embodiments. The seal structure 280a has a height H280a ranging from about 0.5 nm to about 30 nm, in accordance with some embodiments. The seal structure 410 has a width W410 ranging from about 0.5 nm to about 10 nm, in accordance with some embodiments. The seal structure 410 has a height H410 ranging from about 0.5 nm to about 30 nm, in accordance with some embodiments.

The seal structure 280a' has a width W280a' ranging from about 0.5 nm to about 10 nm, in accordance with some embodiments. The seal structure 280a' has a height H280a' ranging from about 0.5 nm to about 30 nm, in accordance with some embodiments. The seal structure 420 has a width W420 ranging from about 0.5 nm to about 10 nm, in accordance with some embodiments. The seal structure 420 has a height H420 ranging from about 0.5 nm to about 30 nm, in accordance with some embodiments.

Figure 5B:
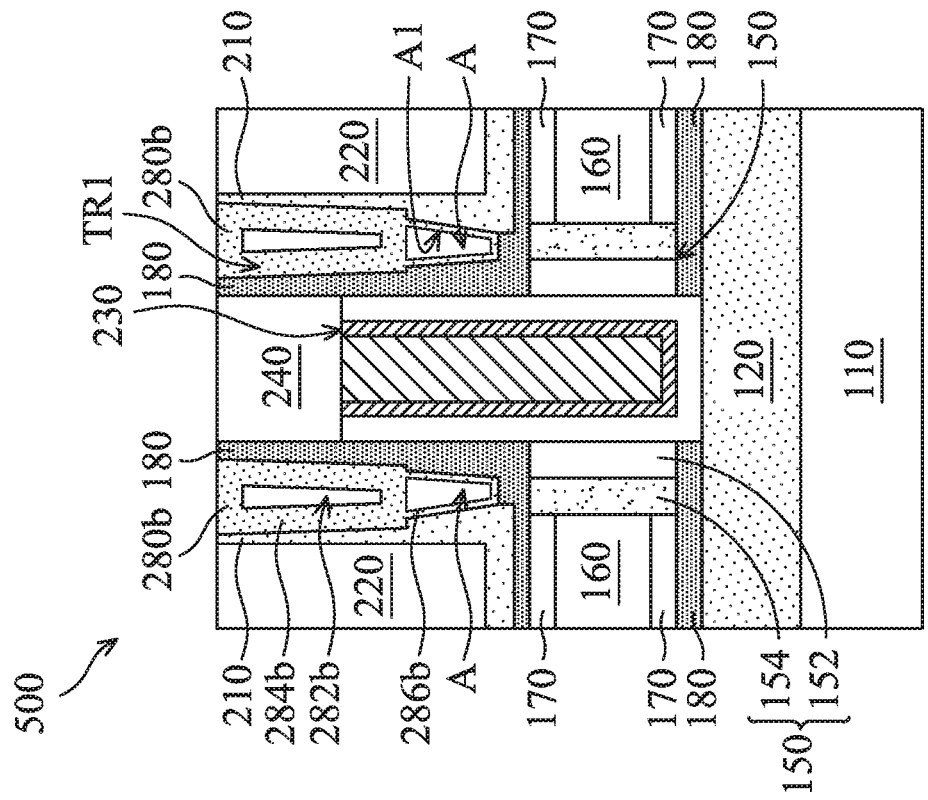
FIG. 5B is a cross-sectional view illustrating the second variation of the semiconductor device structure of FIG. 2K-2, in accordance with some embodiments.
Figure 5A:
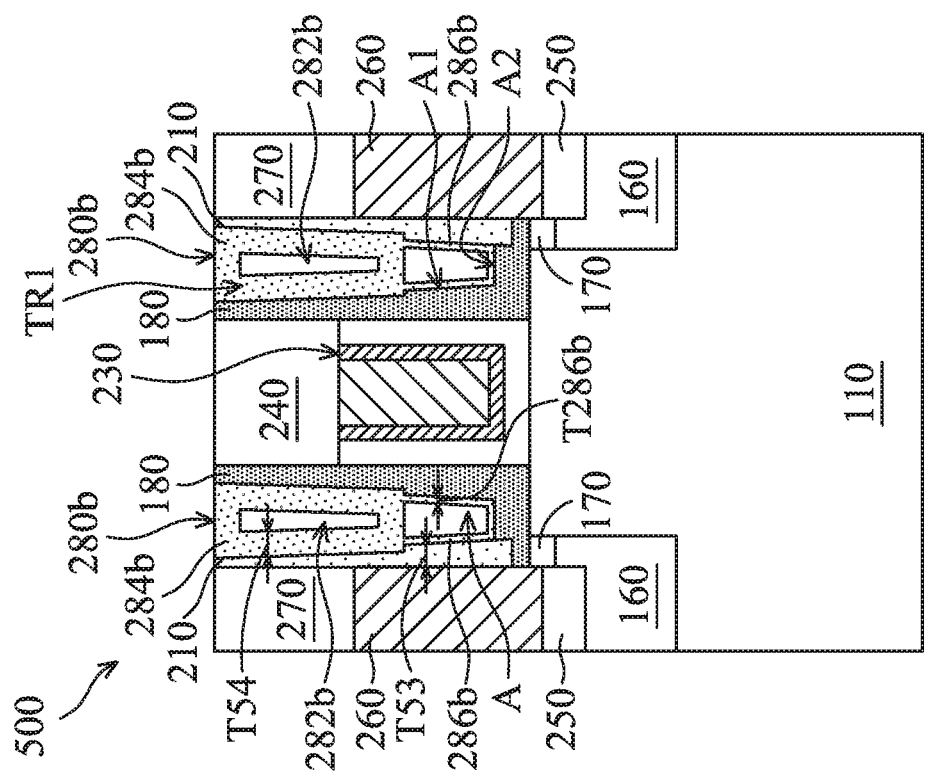
FIG. 5A is a cross-sectional view illustrating a second variation of the semiconductor device structure of FIG. 2K-1, in accordance with some embodiments.

FIG. 5A is a cross-sectional view illustrating a second variation of the semiconductor device structure 200 of FIG. 2K-1, in accordance with some embodiments. FIG. 5B is a cross-sectional view illustrating the second variation of the semiconductor device structure 200 of FIG. 2K-2, in accordance with some embodiments.

As shown in FIGS. 5A and 5B, a semiconductor device structure 500 is similar to the semiconductor device structure 200 of FIGS. 2K-1 and 2K-2, except that the seal structure 280b of the semiconductor device structure 500 further has an extending portion 286b in the air gap A, in accordance with some embodiments.

The seal structure 280b has an upper portion 284b and the extending portion 286b, in accordance with some embodiments. The upper portion 284b is in the trench TR1, in accordance with some embodiments. The extending portion 286b conformally covers inner walls A1 and a bottom surface A2 of the air gap A, in accordance with some embodiments.

The extending portion 286b is thinner than the upper portion 284b, in accordance with some embodiments. The extending portion 286b is thinner than the spacer layer 180, in accordance with some embodiments. The extending portion 286b has a thickness T286b ranging from about 0.5 nm to about 5 nm, in accordance with some embodiments.

Figure 6A:
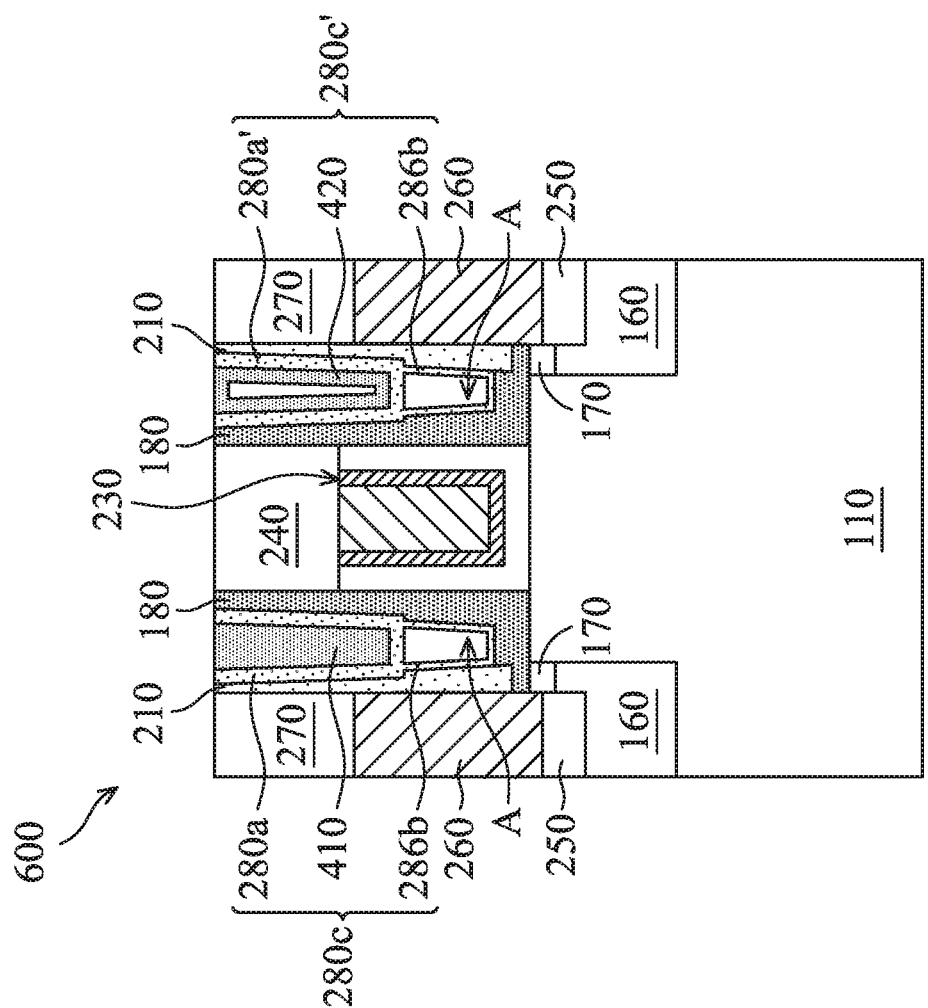
FIG. 6A is a cross-sectional view illustrating a third variation of the semiconductor device structure of FIG. 4A, in accordance with some embodiments.

FIG. 6A is a cross-sectional view illustrating a third variation of the semiconductor device structure 400 of FIG. 4A, in accordance with some embodiments.

Figure 6B:
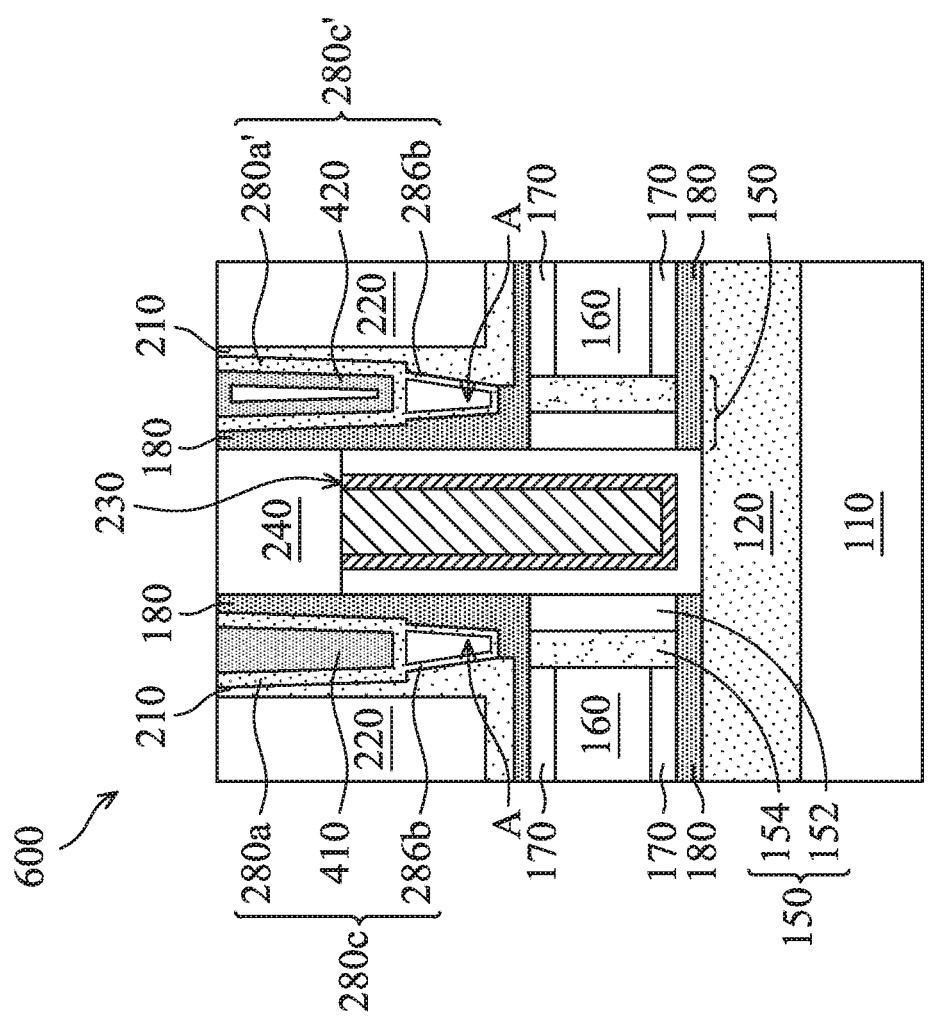
FIG. 6B is a cross-sectional view illustrating the third variation of the semiconductor device structure of FIG. 4B, in accordance with some embodiments.

FIG. 6B is a cross-sectional view illustrating the third variation of the semiconductor device structure 400 of FIG. 4B, in accordance with some embodiments.

As shown in FIGS. 6A and 6B, a semiconductor device structure 600 is similar to the semiconductor device structure 400 of FIGS. 4A and 4B, except that the seal structure 280c of the semiconductor device structure 600 includes the seal structures 280a and 410 of the semiconductor device structure 400 of FIG. 4A and the extending portion 286b of the semiconductor device structure 500 of FIG. 5A, in accordance with some embodiments.

The seal structure 280c' of the semiconductor device structure 600 includes the seal structures 280a' and 420 of the semiconductor device structure 400 of FIGS. 4A and 4B and the extending portion 286b of the semiconductor device structure 500 of FIGS. 5A and 5B, in accordance with some embodiments.

Figures 7A, 7B:
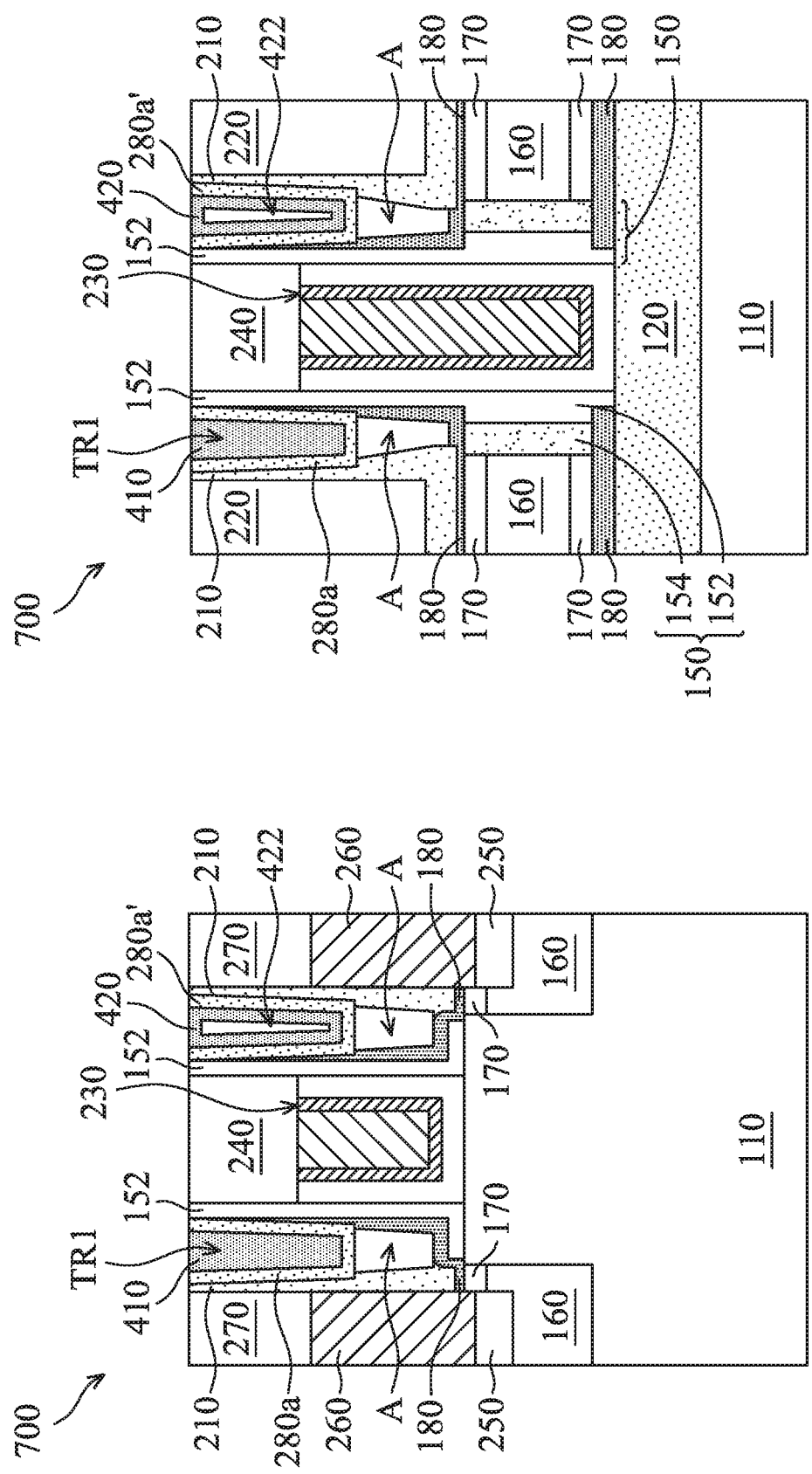
FIG. 7A is a cross-sectional view illustrating a fourth variation of the semiconductor device structure of FIG. 3G-1, in accordance with some embodiments.
FIG. 7B is a cross-sectional view illustrating the fourth variation of the semiconductor device structure of FIG. 3G-2, in accordance with some embodiments.

FIG. 7A is a cross-sectional view illustrating a fourth variation of the semiconductor device structure 300 of FIG. 3G-1, in accordance with some embodiments. FIG. 7B is a cross-sectional view illustrating the fourth variation of the semiconductor device structure 300 of FIG. 3G-2, in accordance with some embodiments.

As shown in FIGS. 7A and 7B, a semiconductor device structure 700 is similar to the semiconductor device structure 300 of FIGS. 3G-1 and 3G-2, except that the semiconductor device structure 700 further includes the seal structures 280a, 280a', 410, and 420 of the semiconductor device structure 400 of FIGS. 4A and 4B, in accordance with some embodiments.

Figure 8B:
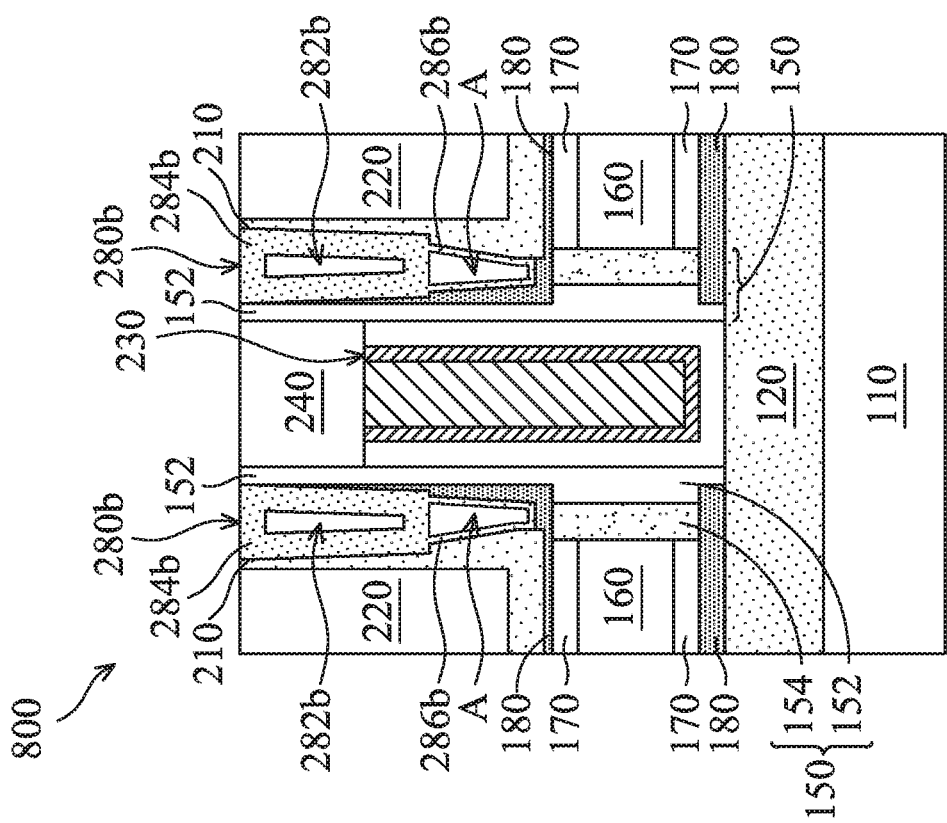
FIG. 8B is a cross-sectional view illustrating the fifth variation of the semiconductor device structure of FIG. 3G-2, in accordance with some embodiments.
Figure 8A:
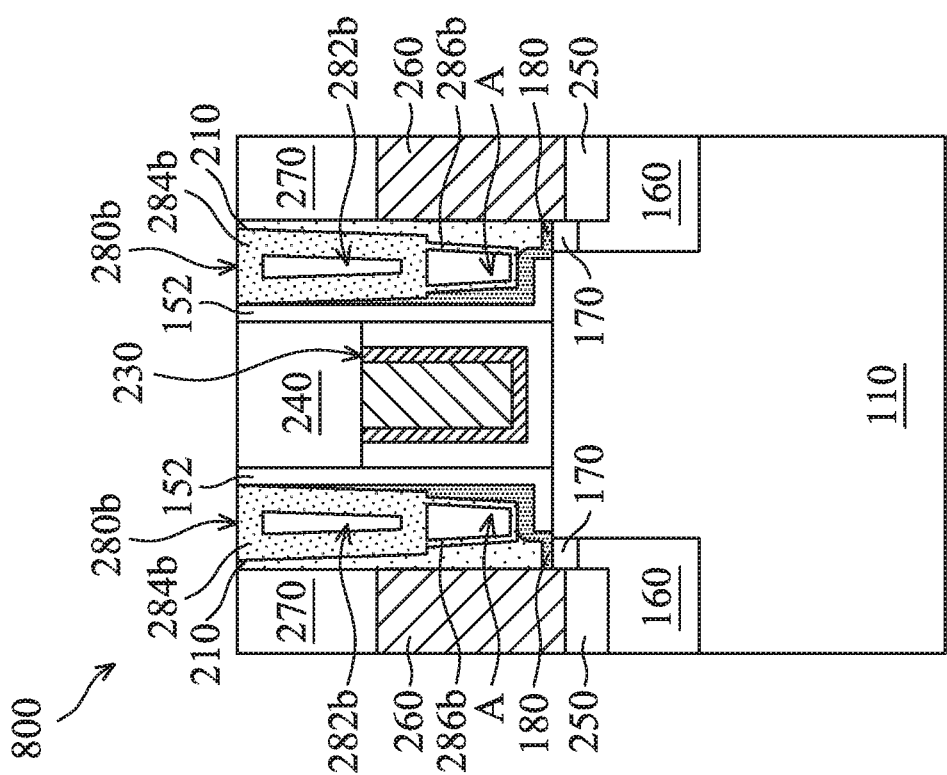
FIG. 8A is a cross-sectional view illustrating a fifth variation of the semiconductor device structure of FIG. 3G-1, in accordance with some embodiments.

FIG. 8A is a cross-sectional view illustrating a fifth variation of the semiconductor device structure 300 of FIG. 3G-1, in accordance with some embodiments. FIG. 8B is a cross-sectional view illustrating the fifth variation of the semiconductor device structure 300 of FIG. 3G-2, in accordance with some embodiments.

As shown in FIGS. 8A and 8B, a semiconductor device structure 800 is similar to the semiconductor device structure 300 of FIGS. 3G-1 and 3G-2, except that the semiconductor device structure 800 further includes the seal structures 280b of the semiconductor device structure 500 of FIGS. 5A and 5B, in accordance with some embodiments.

Figure 9A:
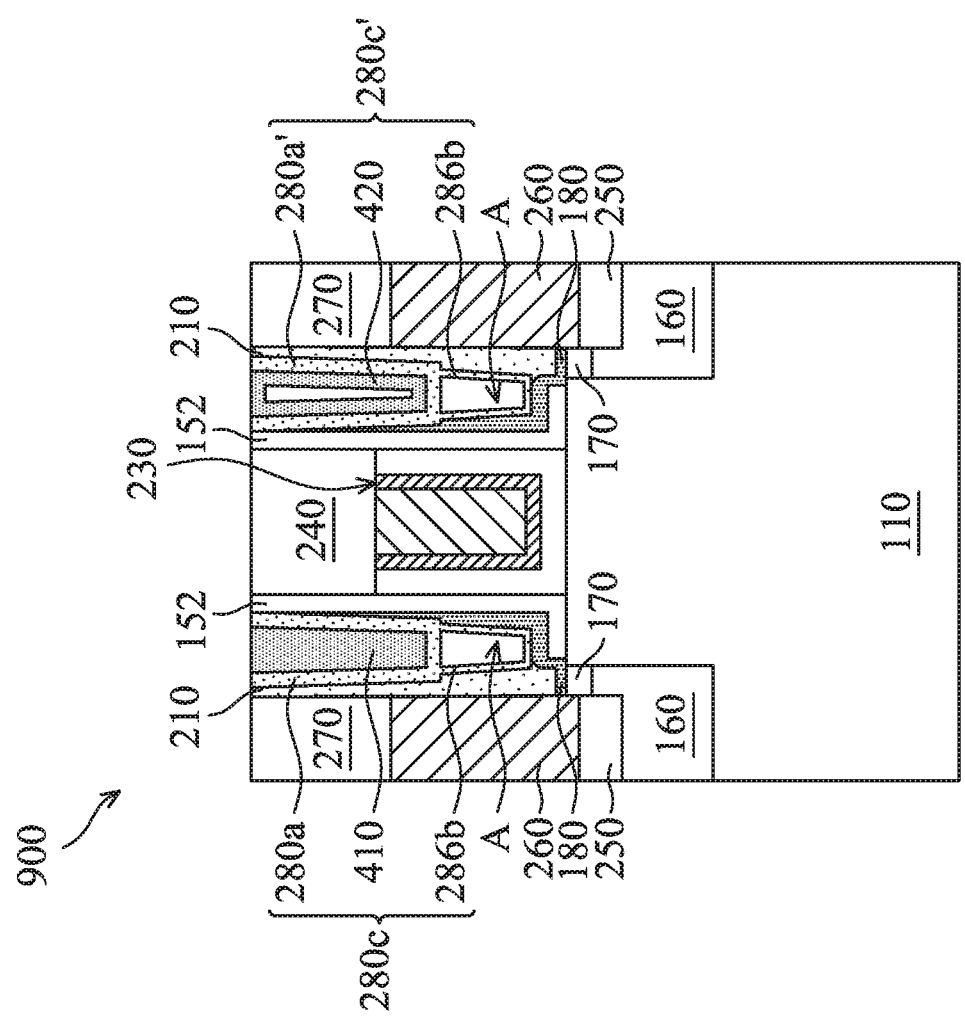
FIG. 9A is a cross-sectional view illustrating a sixth variation of the semiconductor device structure of FIG. 3G-1, in accordance with some embodiments.
Figure 9B:
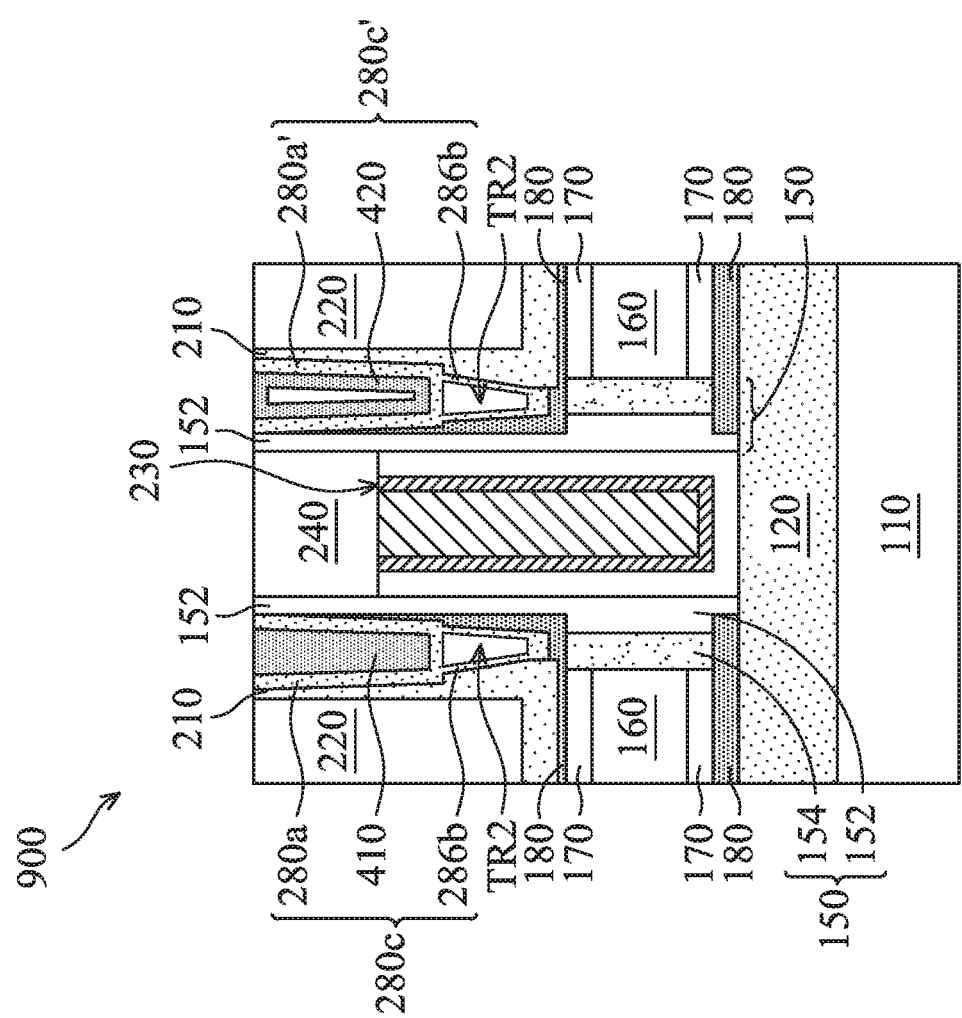
FIG. 9B is a cross-sectional view illustrating the sixth variation of the semiconductor device structure of FIG. 3G-2, in accordance with some embodiments.

FIG. 9A is a cross-sectional view illustrating a sixth variation of the semiconductor device structure 300 of FIG. 3G-1, in accordance with some embodiments. FIG. 9B is a cross-sectional view illustrating the sixth variation of the semiconductor device structure 300 of FIG. 3G-2, in accordance with some embodiments.

As shown in FIGS. 9A and 9B, a semiconductor device structure 900 is similar to the semiconductor device structure 300 of FIGS. 3G-1 and 3G-2, except that the semiconductor device structure 900 further includes the seal structures 280c and 280c' of the semiconductor device structure 600 of FIGS. 6A and 6B, in accordance with some embodiments.

Processes and materials for forming the semiconductor device structures 400, 500, 600, 700, 800 and 900 may be similar to, or the same as, those for forming the semiconductor device structures 200 and 300 described above.

In accordance with some embodiments, semiconductor device structures and methods for forming the same are provided. The methods (for forming the semiconductor device structure) include: removing an upper portion of a spacer structure over a sidewall of a gate stack; forming a spacer layer over the spacer structure; and forming an air gap over the spacer layer and between the gate stack and a contact structure. The materials of the spacer layer and the spacer structure may be different for different purposes. The spacer layer is able to protect the spacer structure. The formation of the air gaps decreases the capacitance between the gate stack and the contact structures. Therefore, the performance of the semiconductor device structure is improved.

In accordance with some embodiments, a semiconductor device structure is provided. The semiconductor device structure includes a substrate having a base and a fin over the base. The semiconductor device structure includes a gate stack wrapping around a first upper portion of the fin. The semiconductor device structure includes a first stressor and a second stressor respectively over opposite first sides of the fin. The first stressor and the second stressor are respectively over opposite second sides of the gate stack. The semiconductor device structure includes a spacer structure between the gate stack and the first stressor. The semiconductor device structure includes a first spacer layer covering a sidewall of the gate stack, the spacer structure, and the first stressor. The semiconductor device structure includes a dielectric layer over the first spacer layer. The semiconductor device structure includes an etch stop layer between the first spacer layer and the dielectric layer. A second upper portion of the etch stop layer is spaced apart from a third upper portion of the first spacer layer. The semiconductor device structure includes a seal structure between the second upper portion and the third upper portion. An air gap is surrounded by the seal structure, the first spacer layer, and the etch stop layer.

In accordance with some embodiments, a semiconductor device structure is provided. The semiconductor device structure includes a substrate having a base and a fin over the base. The semiconductor device structure includes a gate stack wrapping around a first upper portion of the fin. The semiconductor device structure includes a stressor over a first side of the fin and a second side of the gate stack. The semiconductor device structure includes a spacer structure over a sidewall of the gate stack. The spacer structure has a second upper portion and a first lower portion thicker than the second upper portion, and the first lower portion is between the gate stack and the stressor. The semiconductor device structure includes a first spacer layer covering the spacer structure and the stressor. The semiconductor device structure includes a dielectric layer over the first spacer layer. The semiconductor device structure includes an etch stop layer between the first spacer layer and the dielectric layer. A third upper portion of the etch stop layer is spaced apart from a fourth upper portion of the first spacer layer. The semiconductor device structure includes a seal structure between the third upper portion and the fourth upper portion. An air gap is surrounded by the seal structure, the first spacer layer, and the etch stop layer.

In accordance with some embodiments, a method for forming a semiconductor device structure is provided. The method includes forming an isolation layer over a substrate. The substrate has a base and a fin over the base, and the isolation layer is over the base. The method includes forming a gate stack over the fin and the isolation layer. The method includes forming a spacer structure over a first sidewall of the gate stack. The method includes forming a stressor over a side of the fin. A portion of the spacer structure is between the gate stack and the stressor. The method includes at least partially removing the spacer structure not covered by the stressor. The method includes forming a first spacer layer over the first sidewall of the gate stack, the fin, and the portion of the spacer structure. The method includes forming a second spacer layer over the first spacer layer over the first sidewall. The method includes forming an etch stop layer over the second spacer layer and the first spacer layer. The method includes removing the second spacer layer to form a first trench between the first spacer layer and the etch stop layer. The method includes forming a seal structure in a first upper portion of the first trench. An air gap is in a lower portion of the first trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
a substrate having a base and a fin over the base;
a gate stack wrapping around a first upper portion of the fin;
a first stressor and a second stressor respectively extending horizontally from opposite first sides of the fin, wherein the first stressor and the second stressor respectively extend horizontally from opposite second sides of the gate stack;
a spacer structure between the gate stack and the first stressor;
a first spacer layer covering a sidewall of the gate stack, the spacer structure, and the first stressor;
a dielectric layer over the first spacer layer;
an etch stop layer between the first spacer layer and the dielectric layer, wherein a second upper portion of the etch stop layer is spaced apart from a third upper portion of the first spacer layer; and
a seal structure between the second upper portion and the third upper portion, wherein an air gap is surrounded by the seal structure, the first spacer layer, and the etch stop layer.

2. The semiconductor device structure as claimed in claim 1, wherein a portion of the air gap is over the spacer structure.

3. The semiconductor device structure as claimed in claim 1, further comprising:
a contact structure passing through the dielectric layer, the etch stop layer, and the first spacer layer, wherein the contact structure is electrically connected to the first stressor.

4. The semiconductor device structure as claimed in claim 3, wherein the air gap is between the gate stack and the contact structure.

5. The semiconductor device structure as claimed in claim 1, wherein a portion of the air gap is over the fin.

6. The semiconductor device structure as claimed in claim 1, wherein the spacer structure has a second spacer layer and a third spacer layer, the second spacer layer is between the third spacer layer and the gate stack, and the second spacer layer and the third spacer layer are made of different materials.

7. The semiconductor device structure as claimed in claim 1, wherein the seal structure has a void.

8. The semiconductor device structure as claimed in claim 1, wherein the etch stop layer has a first stair-shaped sidewall.

9. The semiconductor device structure as claimed in claim 8, wherein the first spacer layer has a second stair-shaped sidewall facing the first stair-shaped sidewall.

10. The semiconductor device structure as claimed in claim 9, wherein the seal structure is in direct contact with the first stair-shaped sidewall of the etch stop layer and the second stair-shaped sidewall of the first spacer layer.

11. A semiconductor device structure, comprising:
a substrate having a base and a fin over the base;
a gate stack wrapping around a first upper portion of the fin;
a stressor extending horizontally from a first side of the fin and a second side of the gate stack;
a spacer structure over a sidewall of the gate stack, wherein the spacer structure has a second upper portion and a first lower portion thicker than the second upper portion, and the first lower portion is between the gate stack and the stressor;
a first spacer layer covering the spacer structure and the stressor;
a dielectric layer over the first spacer layer;
an etch stop layer between the first spacer layer and the dielectric layer, wherein a third upper portion of the etch stop layer is spaced apart from a fourth upper portion of the first spacer layer; and
a seal structure between the third upper portion and the fourth upper portion, wherein an air gap is surrounded by the seal structure, the first spacer layer, and the etch stop layer.

12. The semiconductor device structure as claimed in claim 11, wherein a first portion of the first spacer layer over the spacer structure is thicker than a second portion of the first spacer layer over the stressor.

13. The semiconductor device structure as claimed in claim 11, wherein the etch stop layer has a first stair-shaped sidewall, and the first spacer layer has a second stair-shaped sidewall facing the first stair-shaped sidewall.

14. The semiconductor device structure as claimed in claim 11, wherein the spacer structure has a second spacer layer and a third spacer layer, the second spacer layer is between the third spacer layer and the gate stack, a first top surface of the second spacer layer is higher than a second top surface of the third spacer layer, and the second spacer layer and the third spacer layer are made of different materials.

15. The semiconductor device structure as claimed in claim 14, wherein the second spacer layer has a fifth upper portion and a second lower portion thicker than the fifth upper portion, and the second lower portion is between the gate stack and the stressor.

16. A method for forming a semiconductor device structure, comprising:
forming an isolation layer over a substrate, wherein the substrate has a base and a fin over the base, and the isolation layer is over the base;
forming a gate stack over the fin and the isolation layer;
forming a spacer structure adjacent a first sidewall of the gate stack;
forming a stressor adjacent a side of the fin, wherein a portion of the spacer structure is between the gate stack and the stressor;
at least partially removing the spacer structure not covered by the stressor;
forming a first spacer layer over the first sidewall of the gate stack, the fin, and the portion of the spacer structure;
forming a second spacer layer over the first spacer layer over the first sidewall;
forming an etch stop layer over the second spacer layer and the first spacer layer;
removing the second spacer layer to form a first trench between the first spacer layer and the etch stop layer; and
forming a seal structure in a first upper portion of the first trench, wherein an air gap is in a lower portion of the first trench.

17. The method for forming the semiconductor device structure as claimed in claim 16, wherein the first spacer layer and the second spacer layer are made of different materials.

18. The method for forming the semiconductor device structure as claimed in claim 17, wherein the second spacer layer and the etch stop layer are made of different materials.

19. The method for forming the semiconductor device structure as claimed in claim 16, wherein the removing of the second spacer layer comprises:
removing a second upper portion of the second spacer layer to form a second trench between the first spacer layer and the etch stop layer;
partially removing the first spacer layer and the etch stop layer through the second trench; and
removing the remaining second spacer layer.

20. The method for forming the semiconductor device structure as claimed in claim 16, wherein the at least partially removing of the spacer structure not covered by the stressor comprises:
removing the spacer structure except for the portion.

* * * * *